(12) United States Patent
McCloud et al.

(10) Patent No.: US 11,175,309 B2
(45) Date of Patent: Nov. 16, 2021

(54) SEMI-AUTOMATIC PROBER

(71) Applicant: QualiTau, Inc., Mountain View, CA (US)

(72) Inventors: Edward McCloud, Castro Valley, CA (US); Jacob Herschmann, Palo Alto, CA (US)

(73) Assignee: QualiTau, Inc., Santa Clara, CA (US)

( * ) Notice: Subject to any disclaimer, the term of this patent is extended or adjusted under 35 U.S.C. 154(b) by 44 days.

(21) Appl. No.: 14/976,810

(22) Filed: Dec. 21, 2015

(65) Prior Publication Data

US 2016/0187377 A1 Jun. 30, 2016

Related U.S. Application Data

(60) Provisional application No. 62/096,693, filed on Dec. 24, 2014.

(51) Int. Cl.
G01R 1/44 (2006.01)
G01R 1/04 (2006.01)
(Continued)

(52) U.S. Cl.
CPC ....... *G01R 1/0408* (2013.01); *G01R 1/06705* (2013.01); *G01R 1/07342* (2013.01); *G01R 31/2865* (2013.01); *G01R 31/2886* (2013.01)

(58) Field of Classification Search
CPC .............. G01R 31/2886; G01R 1/0408; G01R 1/06705; G01R 31/2865; G01R 1/07342;
(Continued)

(56) References Cited

U.S. PATENT DOCUMENTS 3,874,916 A * 4/1975 Livesay .............. H01J 37/3045
430/272.1
6,031,383 A * 2/2000 Streib ................ G01R 1/06705
324/750.19
(Continued)

FOREIGN PATENT DOCUMENTS

CN 102680876 9/2012
CN 102692613 9/2012
(Continued)

OTHER PUBLICATIONS

International Search Report dated Aug. 1, 2016 from International Application No. PCT/US2015/067304.
(Continued)

*Primary Examiner* — Lee E Rodak
*Assistant Examiner* — Brent J Andrews
(74) *Attorney, Agent, or Firm* — Beyer Law Group LLP

(57) ABSTRACT

A wafer probe station system for reliability testing of a semiconductor wafer. The wafer probe station is capable of interfacing with interchangeable modules for testing of semiconductor wafers. The wafer probe station can be used with different interchangeable modules for wafer testing. Modules, such as probe card positioners and air-cooled rail systems, for example, can be mounted or docked to the probe station. The wafer probe station is also provided with a front loading mechanism having a rotatable arm that rotates at least partially out of the probe station chamber for wafer loading.

15 Claims, 27 Drawing Sheets

(51) Int. Cl.
*G01R 31/28* (2006.01)
*G01R 1/073* (2006.01)
*G01R 1/067* (2006.01)

(58) Field of Classification Search
CPC . G01R 1/067; G01R 1/04; G01R 1/44; G01R 31/2601; G01R 31/2863; G01R 31/2874; G01R 31/2855
See application file for complete search history.

(56) References Cited

U.S. PATENT DOCUMENTS

| | | | |
|---|---|---|---|
| 6,114,869 A | 9/2000 | Williams et al. | |
| 6,305,898 B1* | 10/2001 | Yamagishi | H01L 21/67766 414/222.01 |
| 7,126,361 B1* | 10/2006 | Anderson | G01R 1/07342 324/750.08 |
| 2002/0097062 A1* | 7/2002 | Strom | G01R 31/2891 324/750.16 |
| 2003/0035711 A1* | 2/2003 | Gilchrist | H01L 21/68707 414/744.5 |
| 2007/0034479 A1* | 2/2007 | Todaka | H01L 21/6719 198/463.1 |
| 2008/0116918 A1 | 5/2008 | Kanev et al. | |
| 2008/0209720 A1* | 9/2008 | Kim | G01R 3/00 29/842 |
| 2010/0201391 A1* | 8/2010 | Gunji | G01R 31/2865 324/750.03 |
| 2012/0235697 A1 | 9/2012 | Jang | |
| 2012/0242359 A1 | 9/2012 | Obi et al. | |
| 2013/0234745 A1* | 9/2013 | Yamada | G01R 1/44 324/750.11 |
| 2016/0047856 A1* | 2/2016 | Hatta | G01R 31/2865 324/750.03 |

FOREIGN PATENT DOCUMENTS

| | | |
|---|---|---|
| CN | 202770936 | 3/2013 |
| EP | 0 448 316 | 9/1991 |
| EP | 0 975 009 | 1/2000 |
| EP | 0975009 | 1/2000 |
| EP | 1 411 363 | 4/2004 |
| JP | 2000-40728 | 2/2000 |
| JP | 2000-158337 | 6/2000 |
| JP | 2004-140241 | 5/2004 |
| JP | 2008-131048 | 6/2008 |
| JP | 2009-503543 | 1/2009 |
| JP | 2013-187457 | 9/2013 |
| TW | 200424542 | 11/2004 |
| TW | 200708741 | 3/2007 |
| WO | WO 2007/019072 | 2/2007 |

OTHER PUBLICATIONS

Written Opinion dated Aug. 1, 2016 from International Application No. PCT/US2015/067304.
Taiwanese Exam Report and Search Report dated May 15, 2017 from Taiwanese Application No. 104143372.
Chinese Office Action dated Mar. 12, 2019 from Chinese Application No. 201580070723.1.
Chinese Office Action dated Jun. 10, 2020 from Chinese Application No. 201580070723.1.
Japanese Office Action dated Jun. 23, 2020 from Japanese Application No. JP2017-532822.
Japanese Office Action dated Nov. 12, 2019 from Japanese Application No. JP2017-532822.
Chinese Office Action dated Nov. 28, 2019 from Chinese Application No. 201580070723.1.
Search Report dated Nov. 20, 2019 from Chinese Application No. 201580070723.1.
Japanese Office Action dated Mar. 10, 2020 from Japanese Application No. JP2017-532822.
Chinese Office Action dated Dec. 21, 2020 from Chinese Application No. 201580070723.1.
Chinese Office Action and Search Report dated Jul. 26, 2021 from Chinese Application No. 201580070723.1.

* cited by examiner

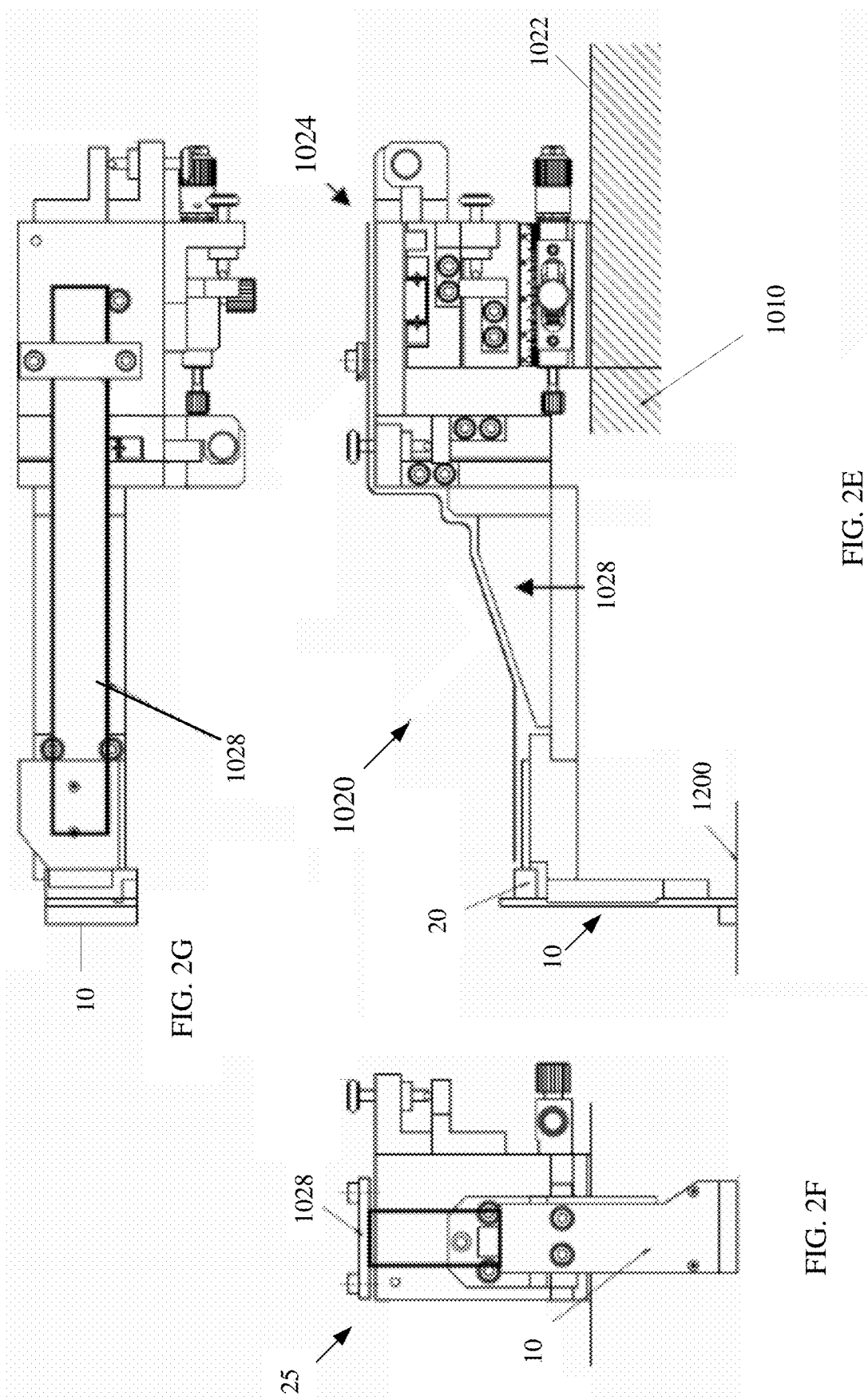

SEMI-AUTOMATIC PROBER

RELATED APPLICATIONS

This application claims the benefit of U.S. Provisional Patent Application No. 62/096,693, filed Dec. 24, 2014, entitled "SEMI-AUTOMATIC PROBER." The foregoing provisional application is hereby incorporated herein by reference in its entirety for all purposes.

BACKGROUND

The present invention relates generally to semiconductor wafer testing. More particularly, the present invention relates to semi-automatic systems for testing of electrical devices on silicon wafers.

Semiconductor reliability tests, which are known as wafer level reliability (WLR) tests, are typically carried out by wafer probers at ambient temperatures as high as 350° C. For electrical testing of semiconductor wafers, a set of probes on a probe card are typically held in place while the semiconductor wafer (mounted on a chuck) is moved into electrical contact with the probe card. The wafer can be vacuum-mounted on a heated chuck. After a die (or array of dice) have been electrically tested, the prober then moves the wafer to the next die (or array) for the next test to begin. The wafer prober usually also loads and unloads the wafers from their carrier (or cassette). A wafer prober can also have automatic pattern recognition optics capable of aligning the contact pads on the wafer with the tips of the probes.

The positional accuracy and repeatability of the wafer chuck movement is vital for making good wafer contact possible. Contact pad sizes in wafers are also getting smaller, so positional accuracy is very important. A wafer probe station that can determine positional accuracy as well as provide versatility and convenience is therefore desirable.

SUMMARY OF THE INVENTION

In accordance with an embodiment, a wafer probe station is provided. The wafer probe station includes an interface capable of accepting a module selected from a plurality of different interchangeable modules. Each module is configured for interfacing at least one probe card with a wafer, and a module can be swapped for a different module.

In accordance with another embodiment, a front loading wafer probe station having a chamber is provided. The probe station includes a pivoting arm and two wafer supporting segments. Each wafer supporting segment is rotatably mounted on the pivoting arm, and the wafer supporting segments are movable between a position inside the chamber and a position at least partially outside the chamber.

In accordance with yet another embodiment, a method is provided for loading a wafer into a wafer probe station. The wafer probe station is provided. The wafer probe station has a wafer loading mechanism housed within a chamber. The wafer loading mechanism includes a pivoting arm and two wafer supporting segments. Each wafer supporting segment is rotatably mounted on the pivoting arm, and the wafer supporting segments are movable between a position inside the chamber and a position at least partially outside the chamber. The chuck is moved from a test position to a loading position. The test position and the loading position are within the chamber. The pivoting arm is rotated to move the wafer supporting segments at least partially outside the chamber. The wafer is then loaded onto the wafer supporting segments. The pivoting arm is rotated to move the wafer supporting segments and the wafer back into the chamber, and the wafer is loaded onto the chuck from the wafer supporting segments.

BRIEF DESCRIPTION OF THE DRAWINGS

The invention, together with further objects and advantages thereof, may best be understood by reference to the following description taken in conjunction with the accompanying drawings in which:

FIG. 2E is a side view of a probe positioner in accordance with an embodiment.

FIG. 2F is a front view of a probe head in accordance with an embodiment.

FIG. 2G is a top view of the probe positioner shown in FIG. 2E.

DETAILED DESCRIPTION OF EMBODIMENTS

The present invention relates generally to a system for reliability testing of a semiconductor wafer. The embodiments herein describe a semi-automated probe station or prober for testing semiconductor wafers.

Embodiments of a semi-automated probe station described herein are capable of testing tens to hundreds of devices under test (DUTs) simultaneously. The probe station can include an anti-vibration table, light tight enclosure, digital camera with high powered optics, vacuum hot chuck, multiple-pin mini-probe cards. With the probe stations described herein, multiple probe cards can be positioned across the surface of a wafer.

As described in more detain herein, embodiments of a wafer probe station can be used with different modules for wafer testing. Modules, such as probe card positioners and air-cooled rail systems, for example, can be interchangeable.

Figure 1A:
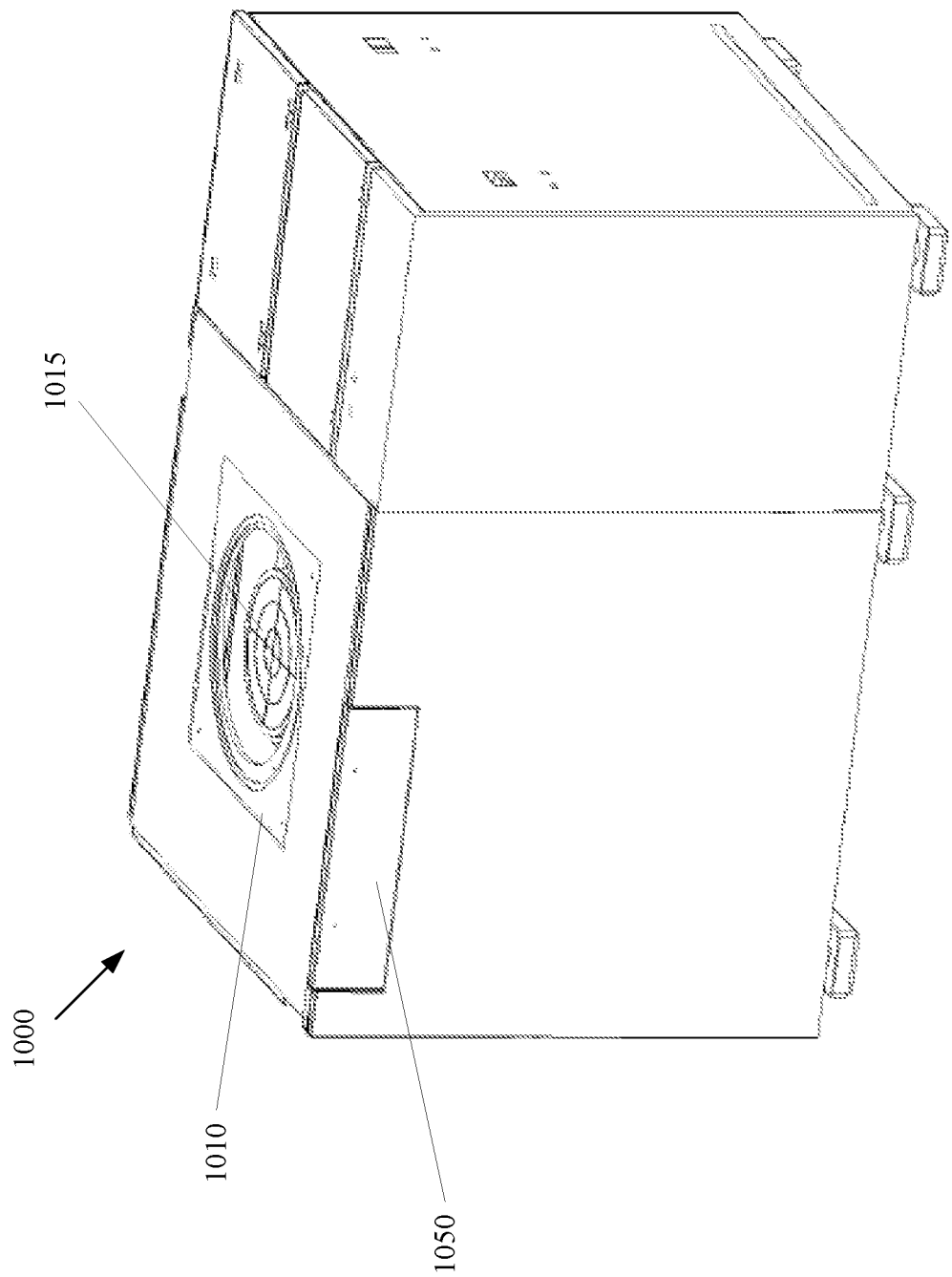
FIG. 1A is a perspective view of an embodiment of a semi-automatic wafer probe station.
Figure 1B:
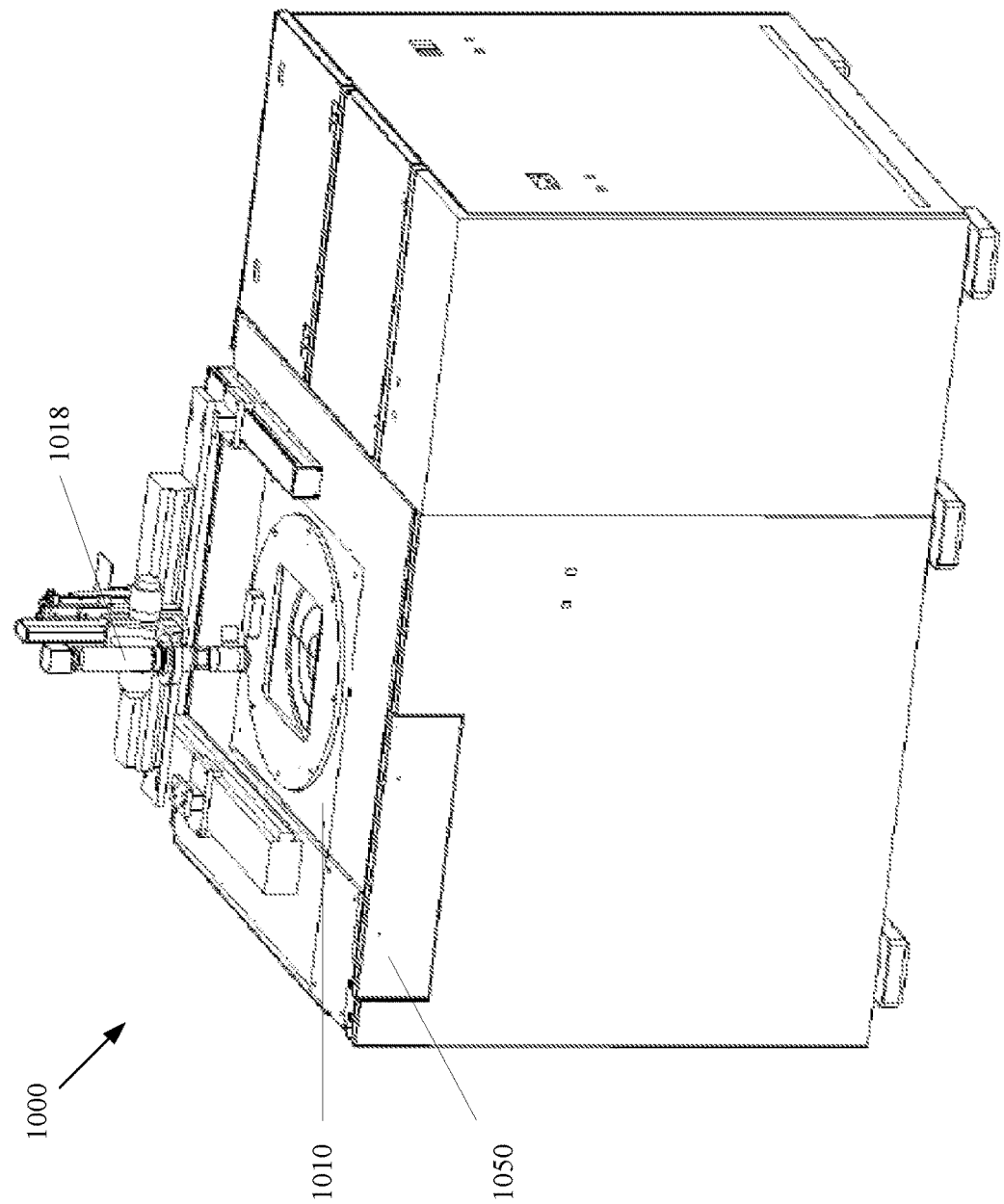
FIG. 1B is a perspective view of an embodiment of a semi-automatic wafer probe station having a microscope assembly.

As shown in FIG. 1A, according to an embodiment, a probe station 1000 can be provided with a mounting plate 1010 on which interchangeable modules can be docked or mounted to provide a user multiple ways of interfacing with a test wafer. The test wafer can be loaded into the probe station chamber and positioned on a chuck 1015, which can be heated, for testing. FIG. 1B shows the probe station 1000 with a microscope assembly 1018, which can be used with the probe station 1000. The microscope assembly 1018 is mounted on support rails 1016. In an embodiment, the support rails 1016 also serve as a frame for a light tight enclosure 1017, which can include multiple retractable panels to form the light tight enclosure 1017 with the frame 1016.

Figure 1C:
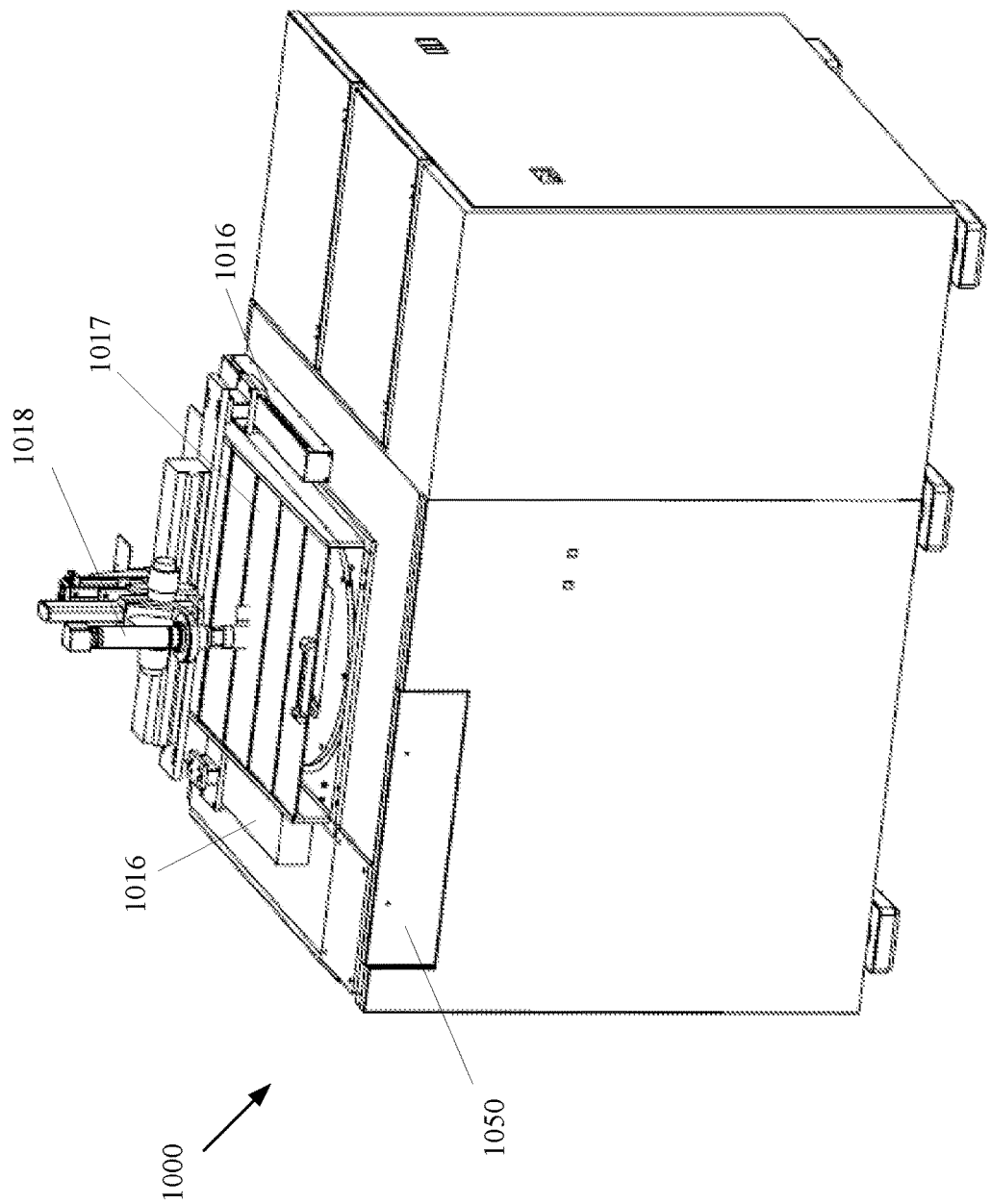
FIG. 1C is a perspective view of an embodiment of a semi-automatic wafer probe station having a microscope assembly and a light tight enclosure.

The interchangeable modules that can be mounted on the mounting plate 1010 of the probe station individual probe positioners 1020 (e.g., single pin probe positioners, vertical probe card positioners, or other types of probe positioners), as shown in FIG. 1. Other types of modules that can be mounted on the mounting plate 1010 include, but are not limited to, rail systems 1030, traditional 4.5" cards, 6.5" cards, various diameter round cards, and custom interfaces for high frequency, high voltage, purged gas, or other custom solutions.

According to the embodiment shown in FIGS. 2A-2D, a probe positioner module 1020 is mounted to a platen 1022, which is docked or mounted to the mounting plate 1010 of the probe station 1000. The platen 1022 and the mounting plate 1010 of the probe station 1000 have common size and mounting hole patterns to allow a user to quickly swap modules as needed. The interchangeable modules can be provided with handles for ease in lifting and positioning of the modules. Modules not in use can be removed from the probe station 1000 and stored as needed. In the illustrated embodiment, the probe positioner 1020 module is bolted in place using cap screws and alignment pins in the common mounting holes of the mounting plate 1010 and the platen 1022. According to other embodiments, cam action latches are provided to allow for simple swapping of modules. Three points of adjustment can be included on the probe station 1000 to allow for planarization and calibration of each module when the module is mounted on the mounting plate 1010.

In an embodiment, as illustrated in FIGS. 2A-2D, the module mounted on the probe station 1000 includes two single XYZT (3-axis linear translation, and rotational movement about the Z axis when considered in standard Cartesian coordinates) probe positioners 1020, which are mounted on the mounting plate 1010 of the probe station 1000. The positioner 1020 can have either a magnetic or vacuum held base stage base 1024 for mounting to the probe station 1000.

The XYZT positioners 1020 are designed to accurately position probe cards, including standard probe cards as well as vertical probe cards, on the probe station 1000 to contact a wafer. As noted above, the XYZT positioners 1020 and the platen 1022 can be mounted on the mounting plate 1010 using any suitable fastener, including bolts, clips, latches, etc. FIG. 2E shows an embodiment of an XYZT positioner 1020. In the illustrated embodiment, the XYZT positioner has a stage base 1024 for mounting to the probe station 1000. The probe card 10 is typically mounted on a probe head 25, as shown in FIG. 2F.

Figure 2A:
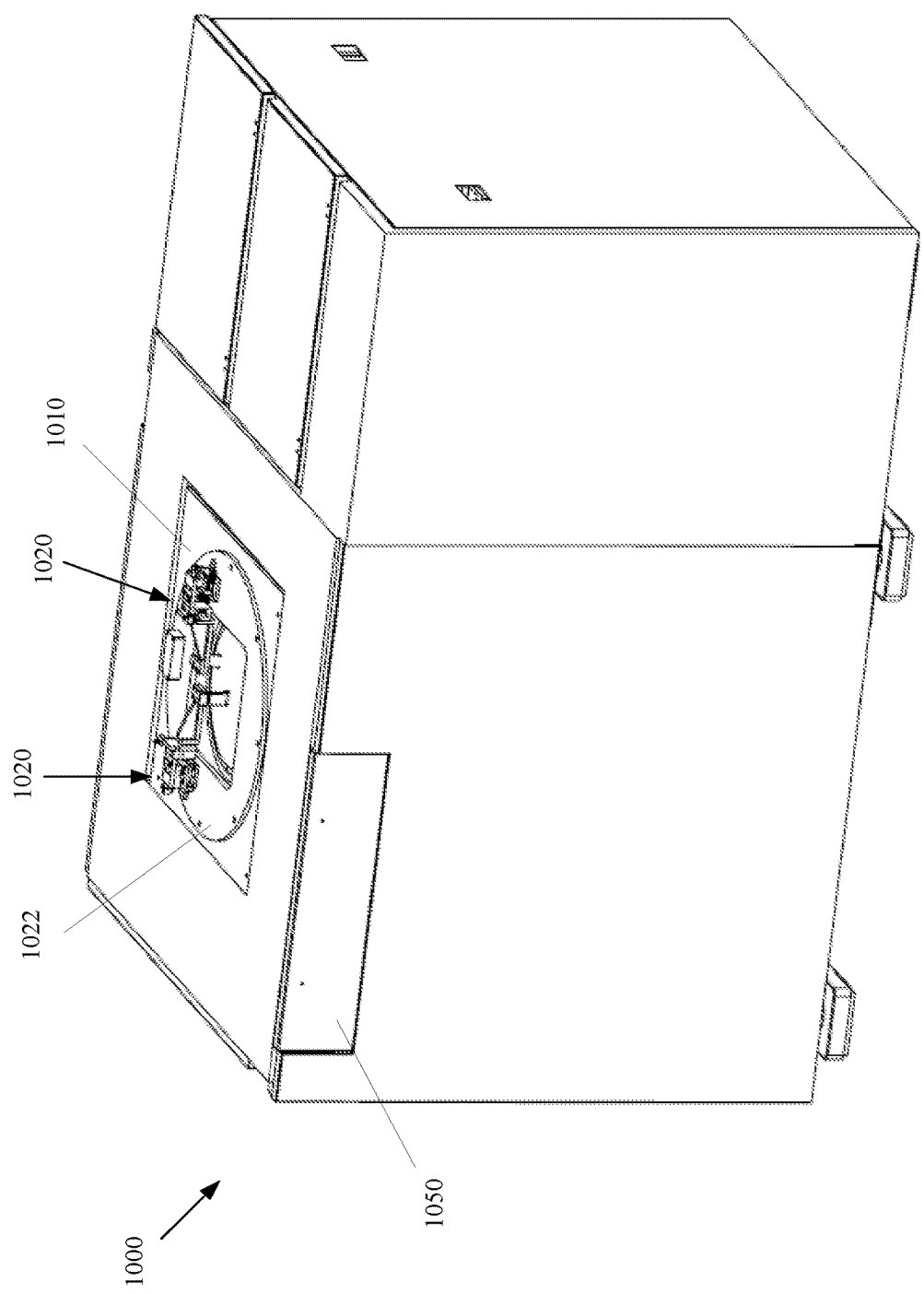
FIG. 2A is a perspective view of an embodiment of a semi-automatic wafer probe station having a probe positioner module docked to its mounting plate.
Figure 2B:
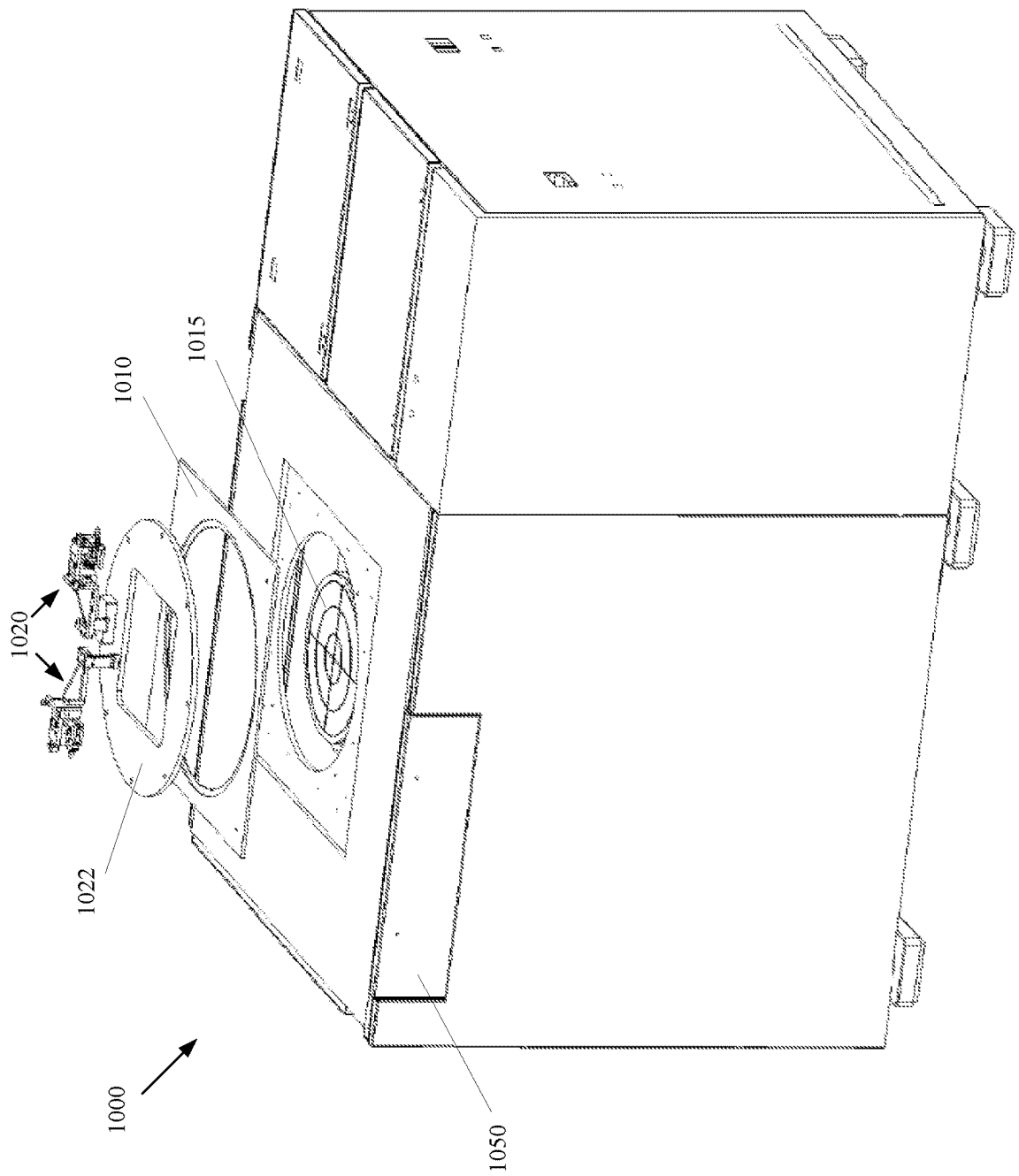
FIG. 2B is an exploded perspective view of the embodiment of the semi-automatic wafer probe station shown in FIG. 2A.
Figure 2C:
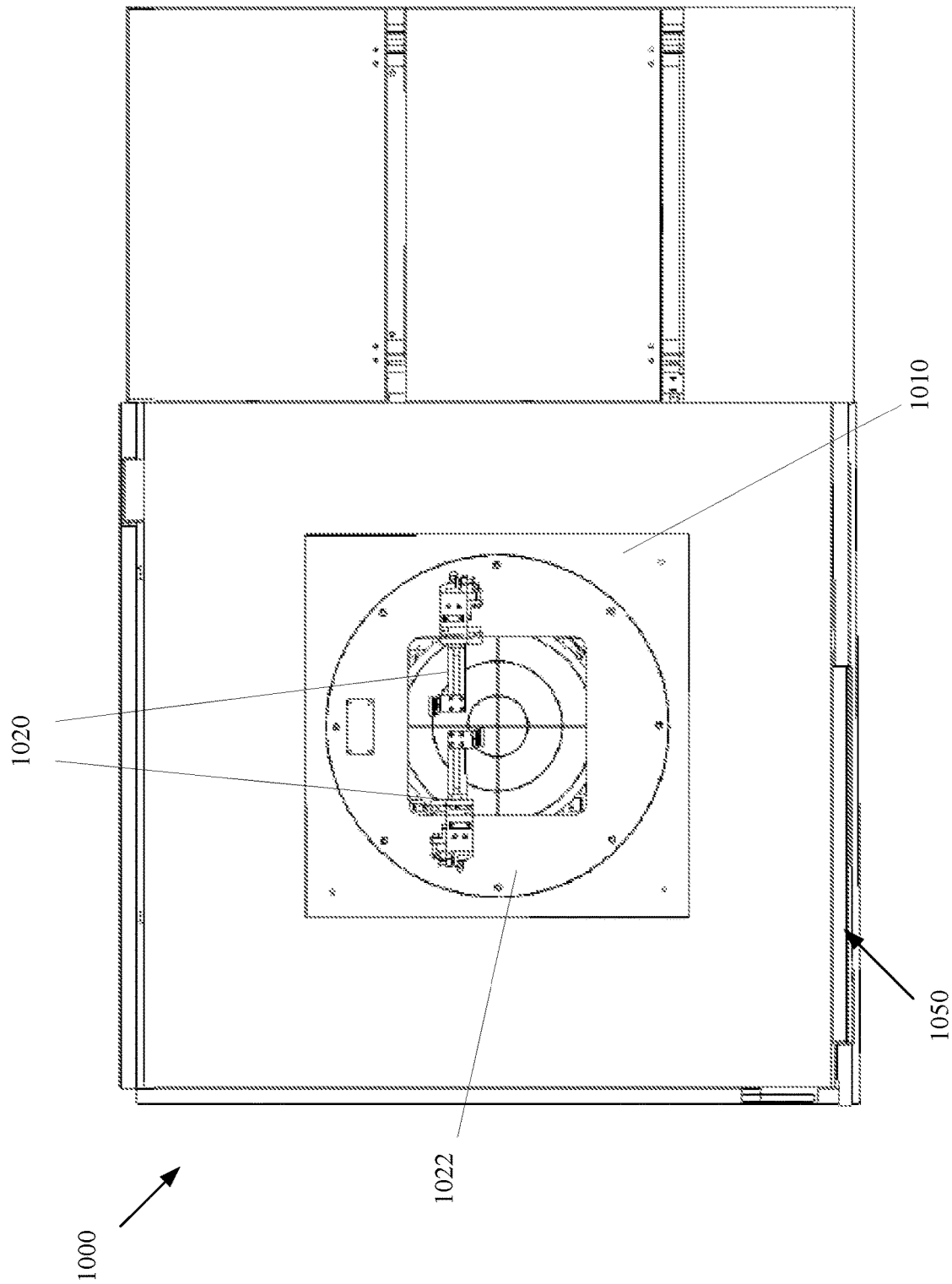
FIG. 2C is a top view of the embodiment of the semi-automatic wafer probe station shown in FIGS. 2A and 2B.
Figure 2D:
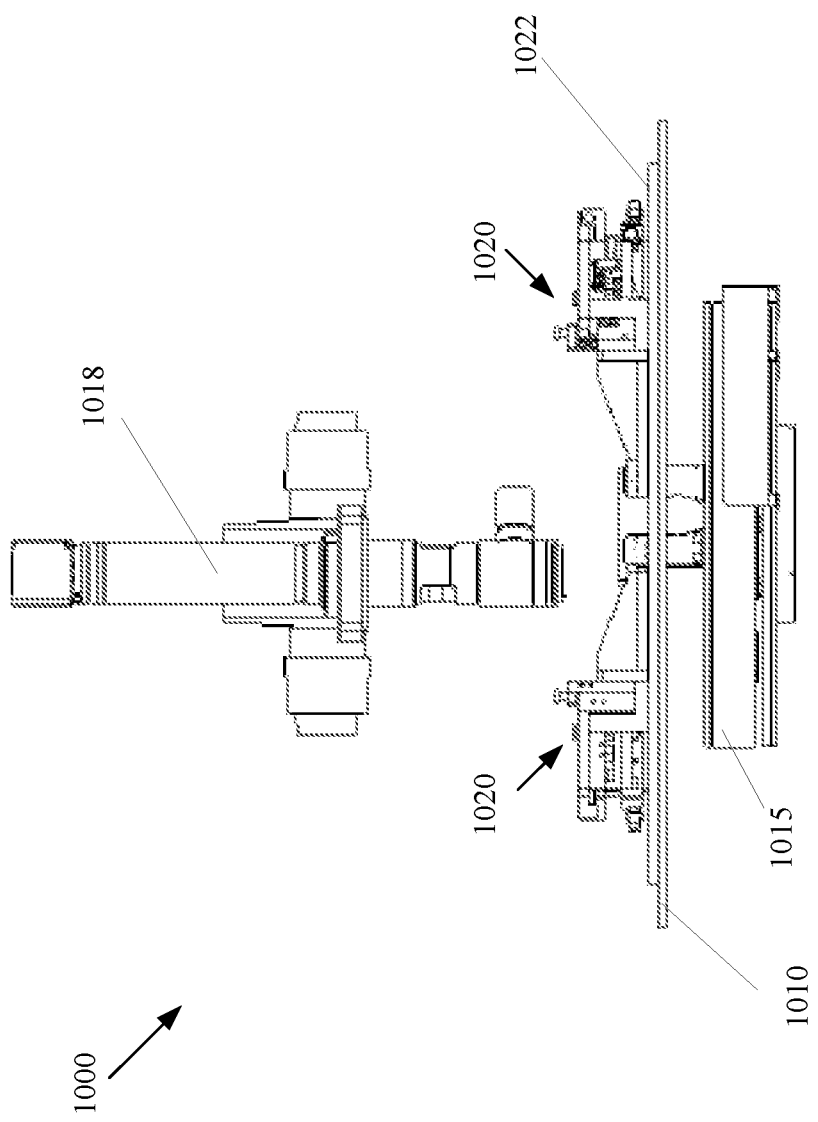
FIG. 2D is a side view of the embodiment of the semi-automatic wafer probe station shown in FIGS. 2A-2C with a microscope assembly.
Figure 2I:
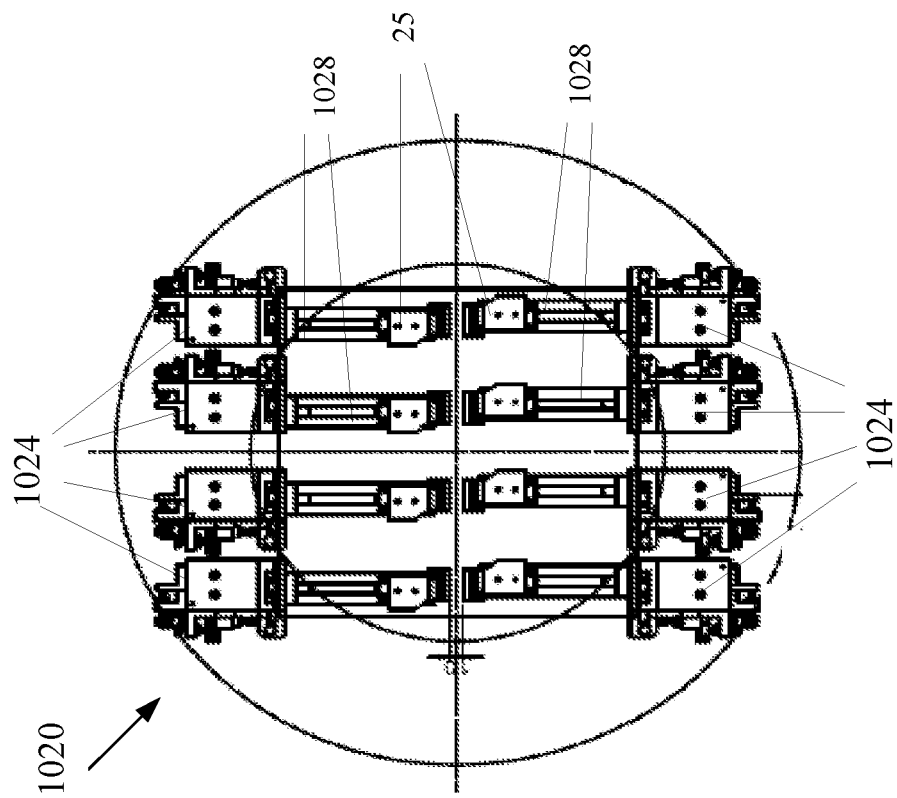
FIG. 2I is a top view of a 8× probe positioner in accordance with another embodiment having longer arms.
Figure 2H:
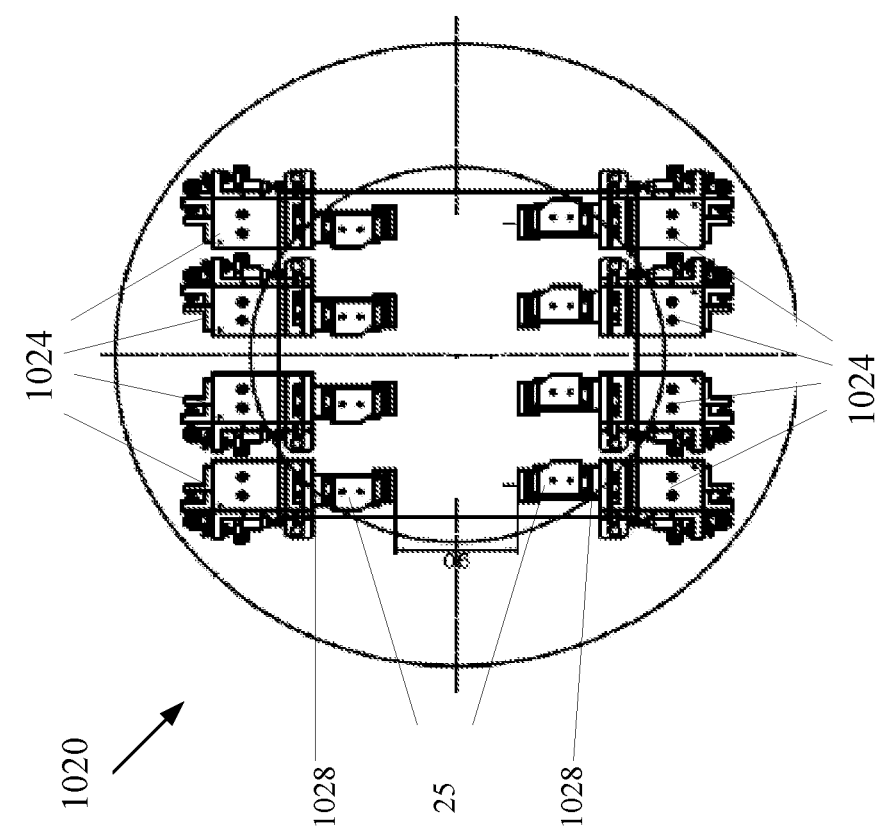
FIG. 2H is a top view of a 8× probe positioner in accordance with an embodiment.

According to an embodiment, the XYZT positioner 1020 can be mounted in any orientation on the mounting plate 1010 of the probe station 1000, and in various configurations as shown. In the illustrated embodiments, as shown in FIGS. 2E-2I, the XYZT probe positioner 1020 has an adaptor arm 1028 mounted with a vertical probe card 10. As shown in FIGS. 2H and 2I, the adaptor arms 1028 can have different lengths in different embodiments. The vertical probe card 10 can be mounted in various orientations at the end of the adaptor arm 1028, to allow for matching the wafer pad orientation as needed. A flex cable routes up the probe head 25, and terminates on a customer interface panel with specific layouts for a given combination of test equipment, and number of heads. The flex cable the probe card 10 to external test apparatus.

The number and position of the probe heads 25 is largely determined by the spacing and orientation of the wafer die to be tested. Examples of positioners 1020 are shown in FIGS. 2H and 2I. Each of the embodiments shown in FIGS. 2H and 2I has eight probe heads 25. The embodiment of the positioner 1020 shown in FIG. 2I has longer adaptor arms 1028 than the embodiment shown in FIG. 2H. It will be understood that a positioner can have more or fewer probe heads, depending on other factors, including the size of the positioner as well as the size of the probe heads.

In one embodiment, the XYZT positioner 1020 has a modular adaptor arm with a probe head 25 mounted at one end for aligning and registering a vertical probe card 10, such as the vertical probe card available from QualiTau, Inc. of Mountain View, Calif., for use in testing of devices on the probe station 1000. An embodiment of a vertical probe card 10 is described below and with reference to FIGS. 3A-3C. Major problems arise from heating of a typical horizontal probe card and probe head system. A horizontal probe card is the closest component to the hot chuck that holds the wafer and can suffer a drastic degradation in performance due to temperature dependent leakage current. The large exposed area of the horizontal probe card exacerbates the degradation in probe performance Since device testing can take place at temperatures up to 300° C., vertical probe cards are useful for testing semiconductor devices at elevated temperatures, as the vertical probe cards keep the electrical signals above and away from a hot chuck.

Figure 3A:
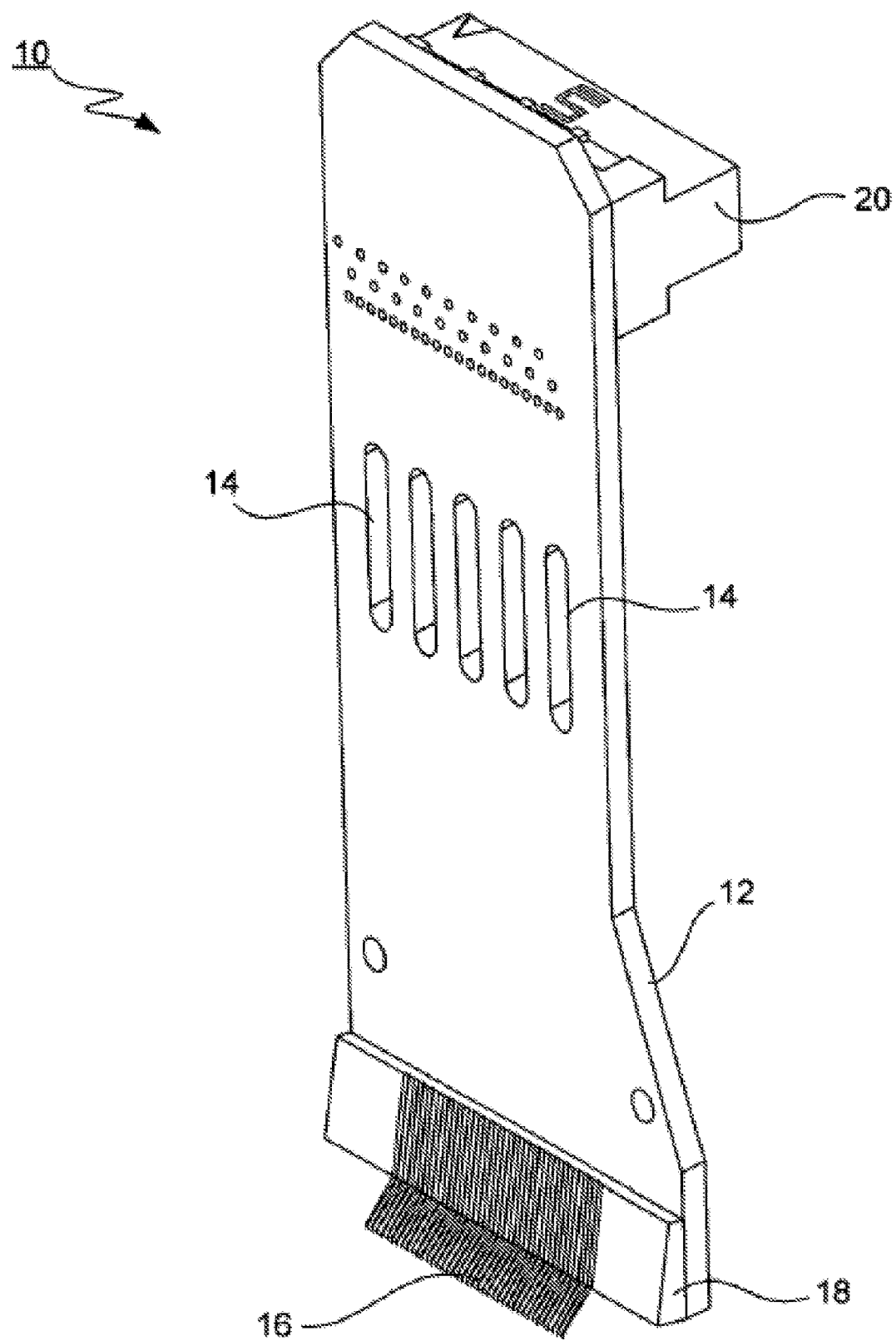
FIG. 3A is a perspective view of an embodiment of a probe card.

FIG. 3A is a perspective view of an embodiment of a vertical probe card 10 and includes a printed circuit board 12 with a plurality of slots 14 therethrough for facilitating the flow of cool air. At one end of the printed circuit board 12 is a tip assembly including a plurality of metal probe tips 16 in a ceramic support 18 and on an opposing end of printed circuit board 12 is an electrical connector and fastener 20 which is used for physically supporting the probe card in a test system and connects the probe tips 16 to a flexible (flex) cable.

Figure 3B:
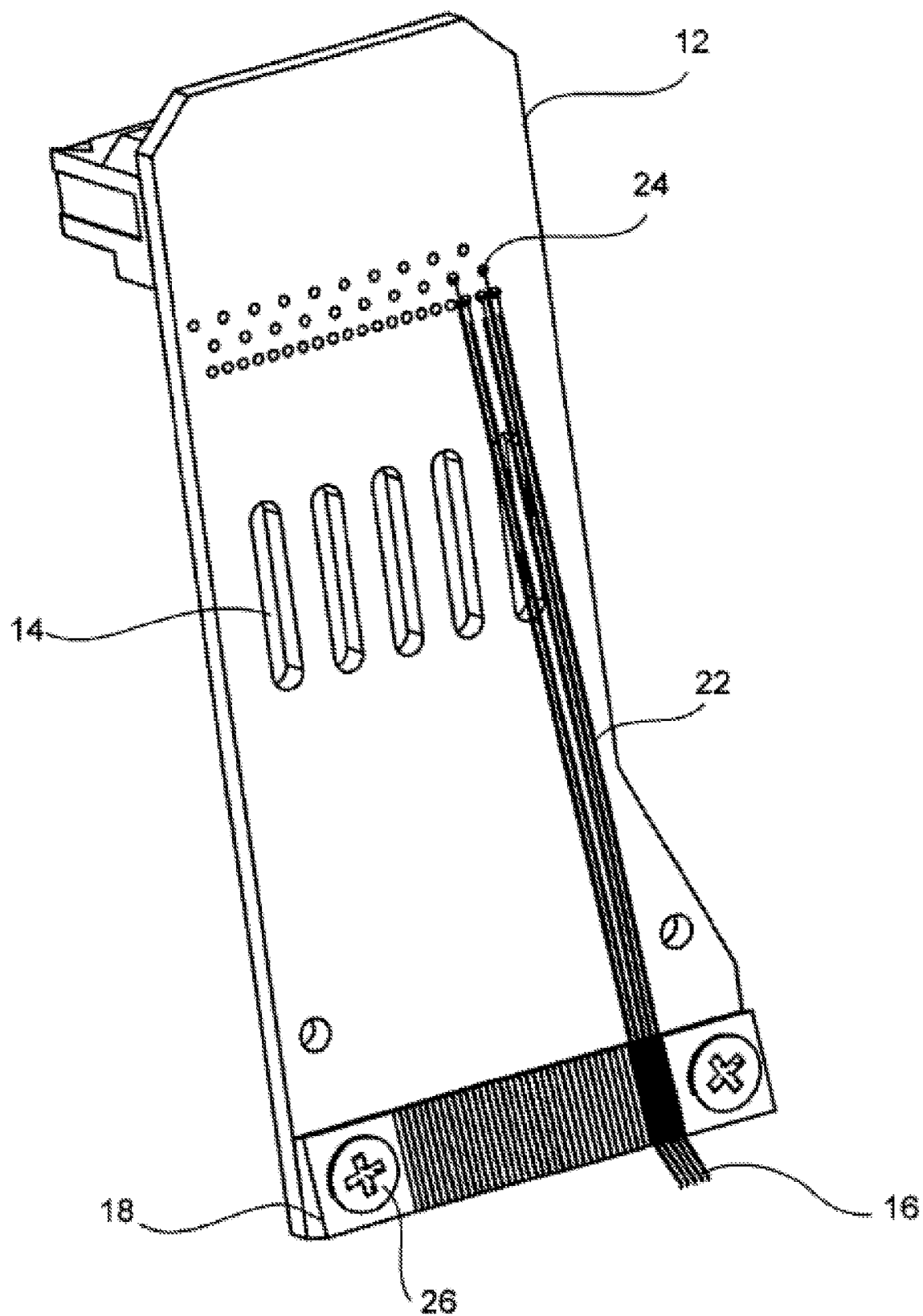
FIG. 3B is a perspective view of the embodiment of the probe card shown in FIG. 3A further illustrating metal traces that electrically interconnect probe tips to electrical contacts on the other end of the printed circuit board.

FIG. 3B further illustrates printed circuit board 12 and metal traces 22 which electrically interconnect the probe tips 16 to electrical contacts 24 on the opposing end of board 12. The electrically conductive pattern of metal traces or discrete wires 22 interconnect individual probe tips to one of the contacts 24. As illustrated, ceramic support 18 with probe tips 16 supported therein is attached to board 12 by means of screw fasteners 26.

Figure 3C:
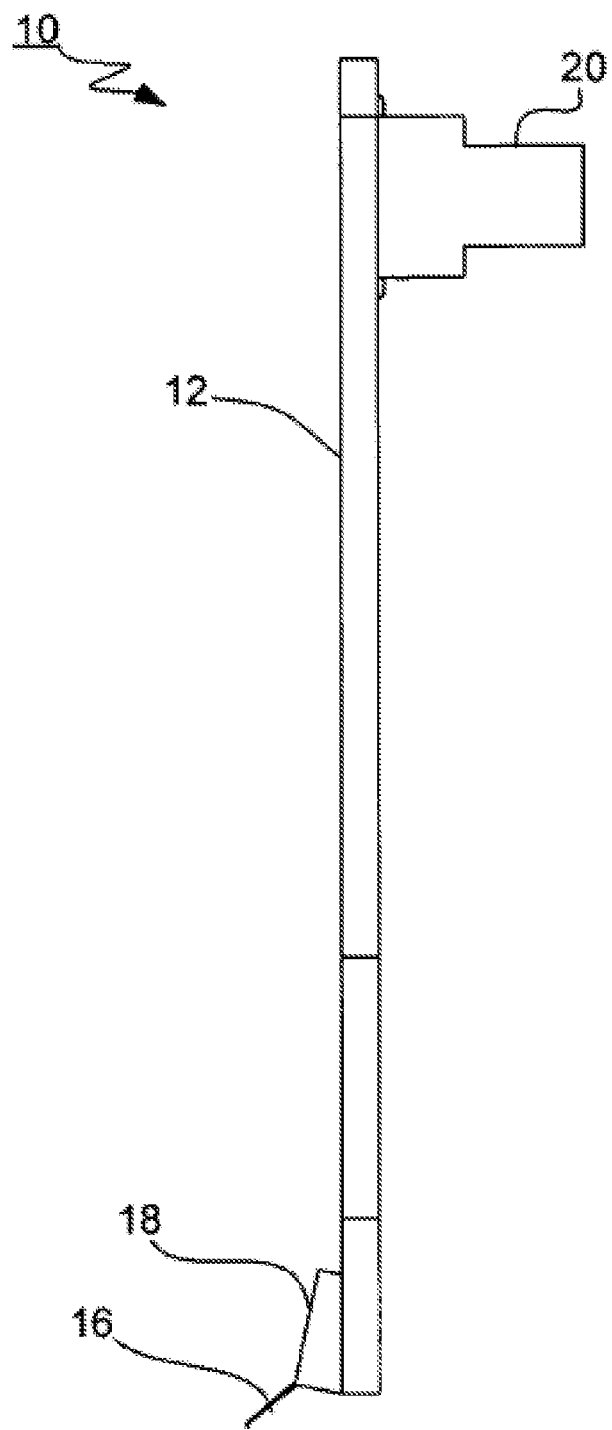
FIG. 3C is a side view of the probe card shown in FIGS. 3A and 3B.
Figure 4A:
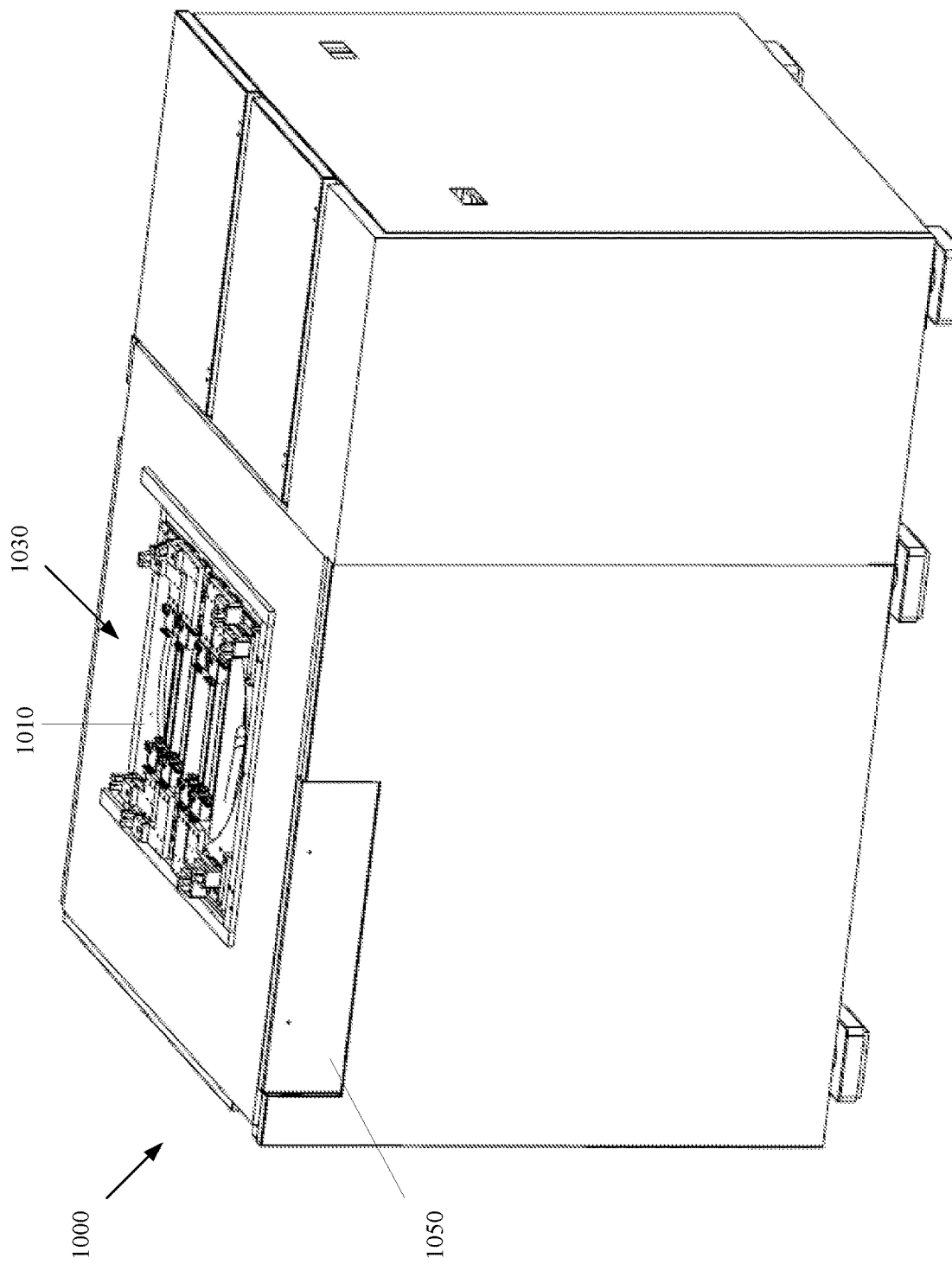
FIG. 4A is a perspective view of an embodiment of a semi-automatic wafer probe station having an air-cooled rail system module docked to its mounting plate.
Figure 4B:
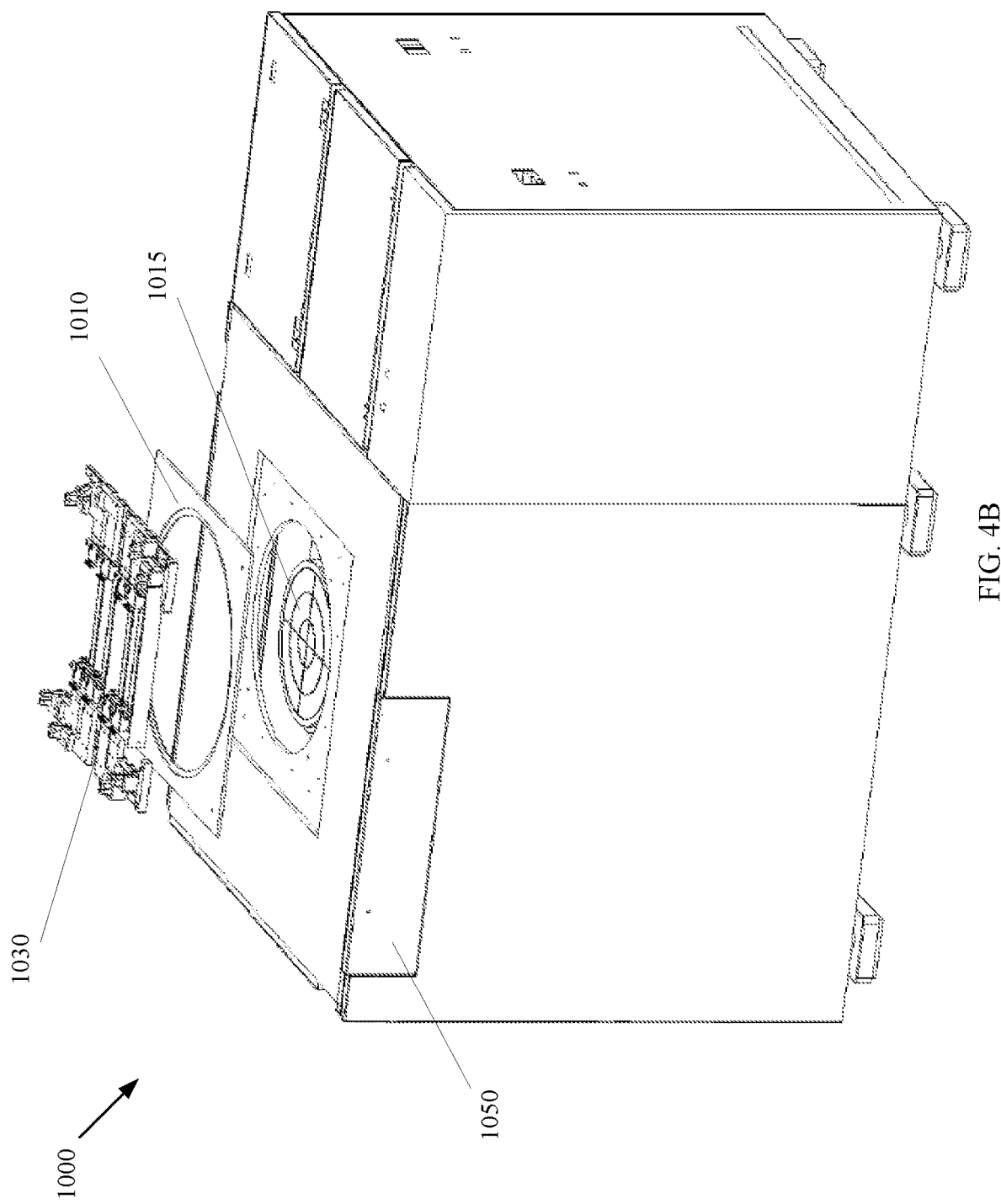
FIG. 4B is an exploded perspective view of the embodiment of the semi-automatic wafer probe station shown in FIG. 4A.
Figure 4C:
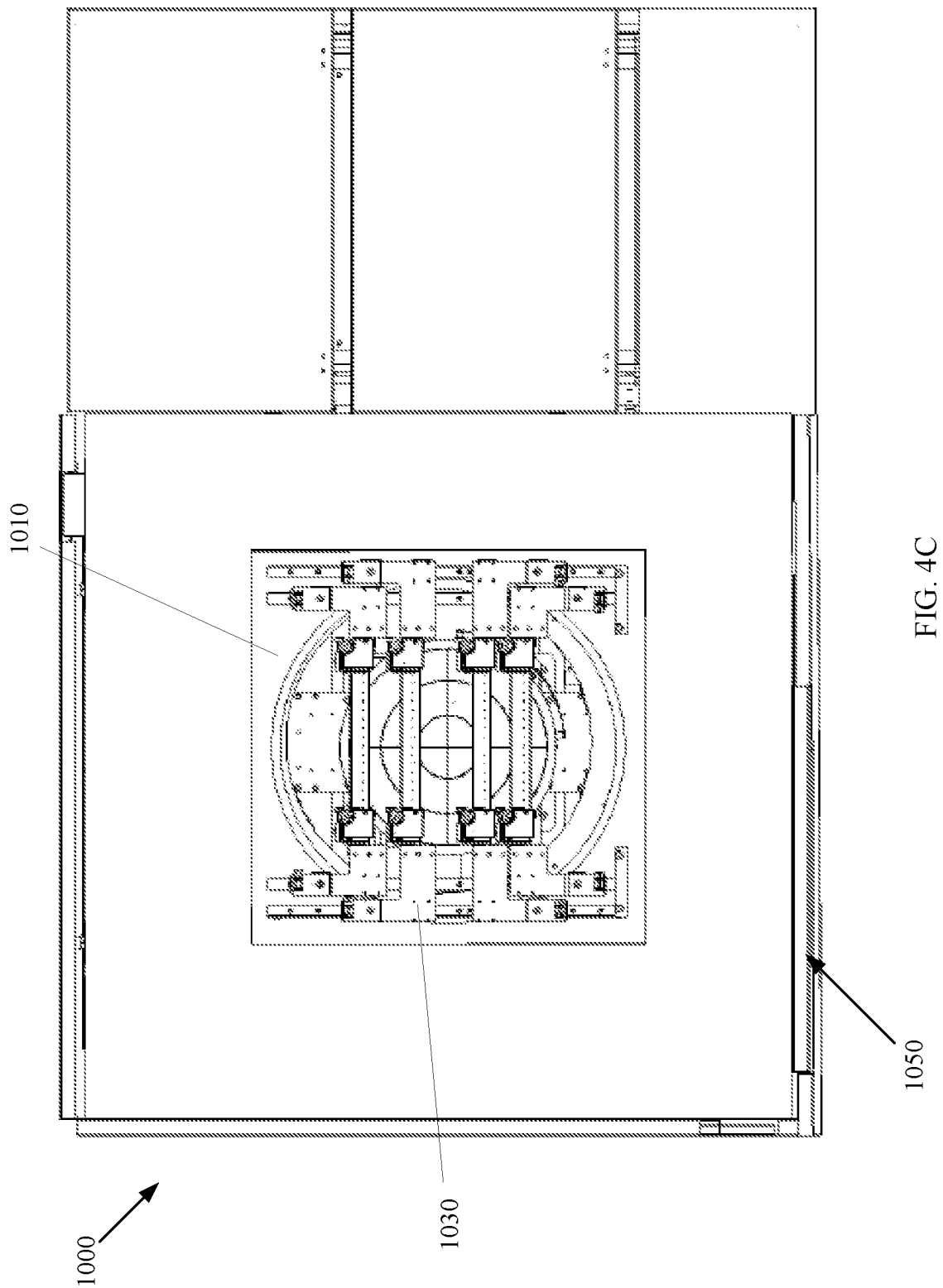
FIG. 4C is a top view of the embodiment of the semi-automatic wafer probe station shown in FIGS. 4A and 4B.
Figure 4D:
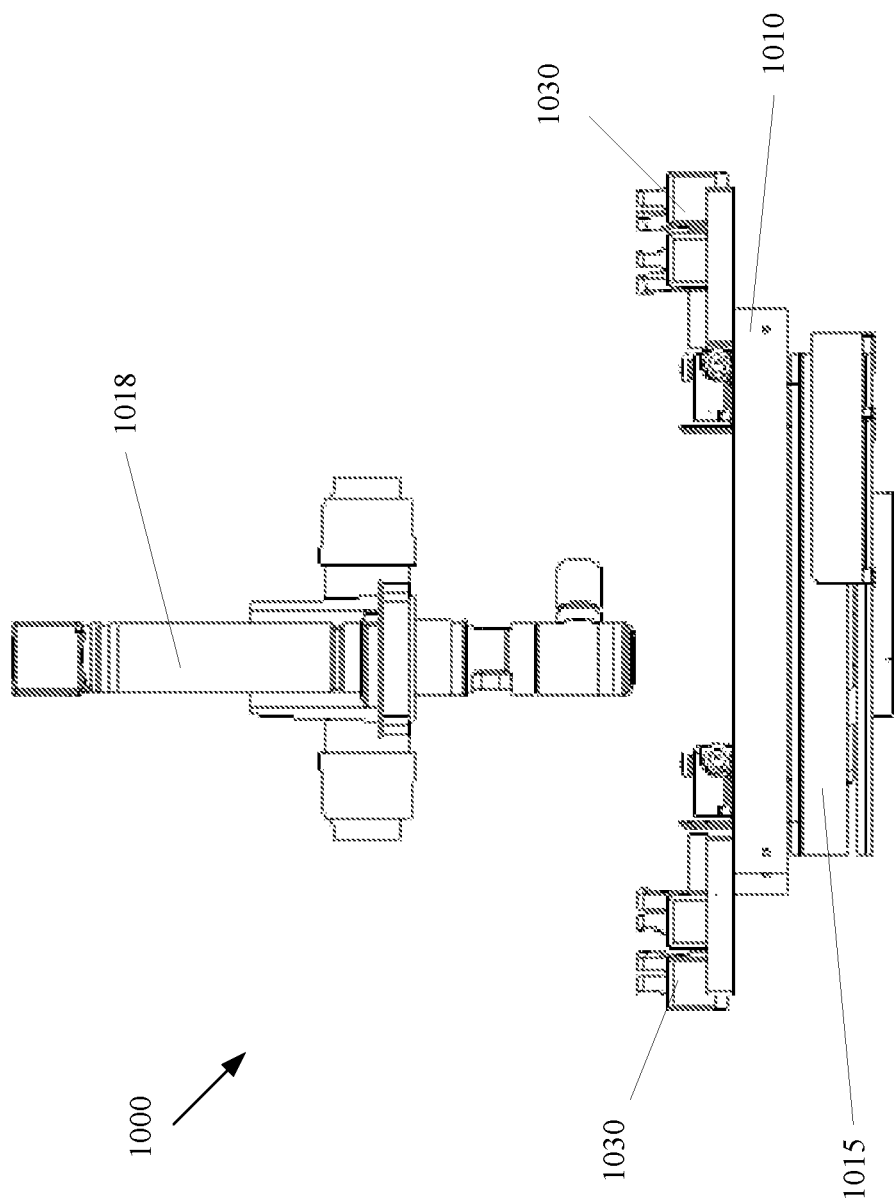
FIG. 4D is a side view of the embodiment of the semi-automatic wafer probe station shown in FIGS. 4A-4C with a microscope assembly.

FIG. 3C is a side view of the probe card illustrating electrical connector and fastener 20 which engages a receptacle in support apparatus to hold probe card 10 in a generally vertical or perpendicular position with respect to a wafer undergoing test. Only the ends of tips 16 engage the device undergoing test, thereby limiting heat conductive flow through the probe tips. The vertical alignment of probe card 10 limits the exposure of the card to heat emitted by the heated device chuck. Moreover, convective flow of air from the heated chuck to the probe card and supporting apparatus is disrupted by flow of cool air provided by the support assembly, as described below. The probe card 10 is typically mounted on a probe head 25, as shown in FIG. 2F.

Reliability testing of semiconductor devices can demand very different and specific equipment for each type of device or testing methodology used. As discussed above, the probe station 1000 addresses the specific needs of each type of device and/or testing methodology by allowing users to use the probe station 1000 to interface with multiple styles and configurations of probe pins, cards, or other contact methods. According to embodiments described herein, a probe station 1000 provides a system for interfacing with different interchangeable modules.

The modular aspect of the probe station 1000 allows the user to easily remove and replace one module with another, depending on the type of wafer testing desired. Custom PCB and connector assemblies are also designed to be interchangeable, depending on the type of equipment being implemented for electrical testing. These assemblies are designed with inputs for triax cables, discrete wiring, coaxial, and other specific cable and connector standards.

To add to the flexibility of step and repeat testing of silicon wafers for reliability analysis, the removable probe positioner 1020 shown in FIG. 2 can be replaced with a different modular assembly. For example, FIGS. 4A-4D show an embodiment of a removable array of air-cooled rails 1030, such as those available from Qualitau, Inc., mounted on the mounting plate 1010 of the probe station 1000.

As shown in FIGS. 4A-4D, an air-cooled rail assembly 1030 can be mounted on the mounting plate 1010 of the semi-automated probe station 1000 as an interchangeable module. The rail assembly 1030 allows testing of multiple die, which is important to increase yield in testing over time, as well as to ensure the appropriate sample size for a given set of test conditions.

The air-cooled rail assembly 1030 and the mounting plate 1010 of the probe station 1000 have common size and mounting hole patterns to allow a user to quickly swap modules as needed. The rail assembly 1030 can be provided with handles for ease in lifting and positioning. In the illustrated embodiment, the rail assembly 1030 module is bolted in place using cap screws and alignment pins in the common mounting holes of the mounting plate 1010 and the rail assembly 1030. According to other embodiments, cam action latches are provided to allow for simple swapping of modules.

Figure 5A:
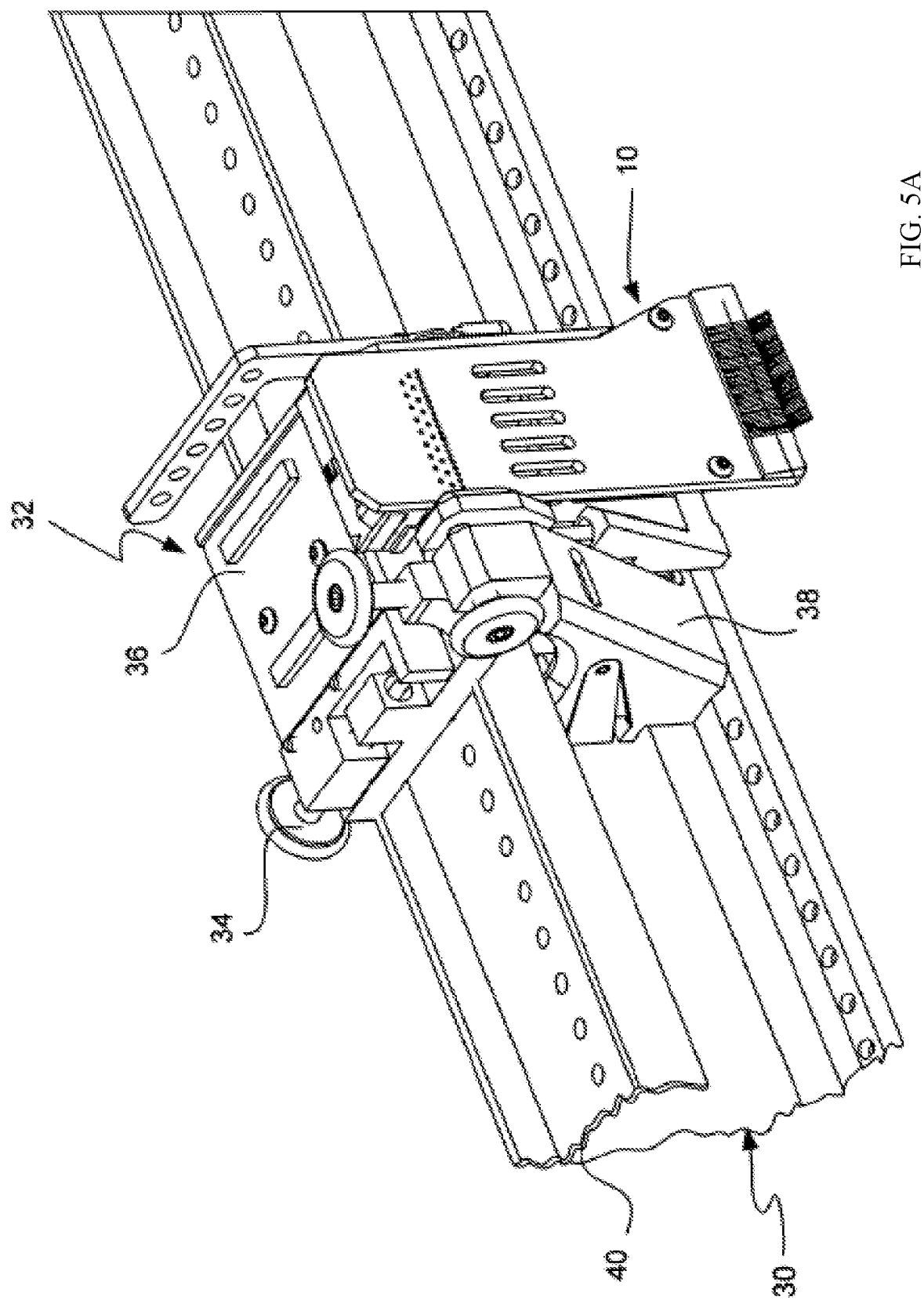
FIG. 5A is is a perspective view of a support rail that supports a vertical probe card.

The rail assembly 1030 includes an array of multiple air-cooled support rails 30 for supporting vertical probe cards 10. FIG. 5A is a perspective view of a support rail 30 that supports a vertical probe card 10 and a probe head shown generally at 32 above a device undergoing test (wafer) and a heated support chuck. In an embodiment, the probe head 32 can be adjusted manually along three axes of movement by means of control knobs 34, 36, 38. According to another embodiment, a user interface can adjust the probe head 32 semi-automatically. A flex cable 40 is supported on the top of rail 30 and interconnects probe card 10 to external test apparatus. It should be noted that the flex cable 40 can degrade in performance if overheated.

Figure 5B:
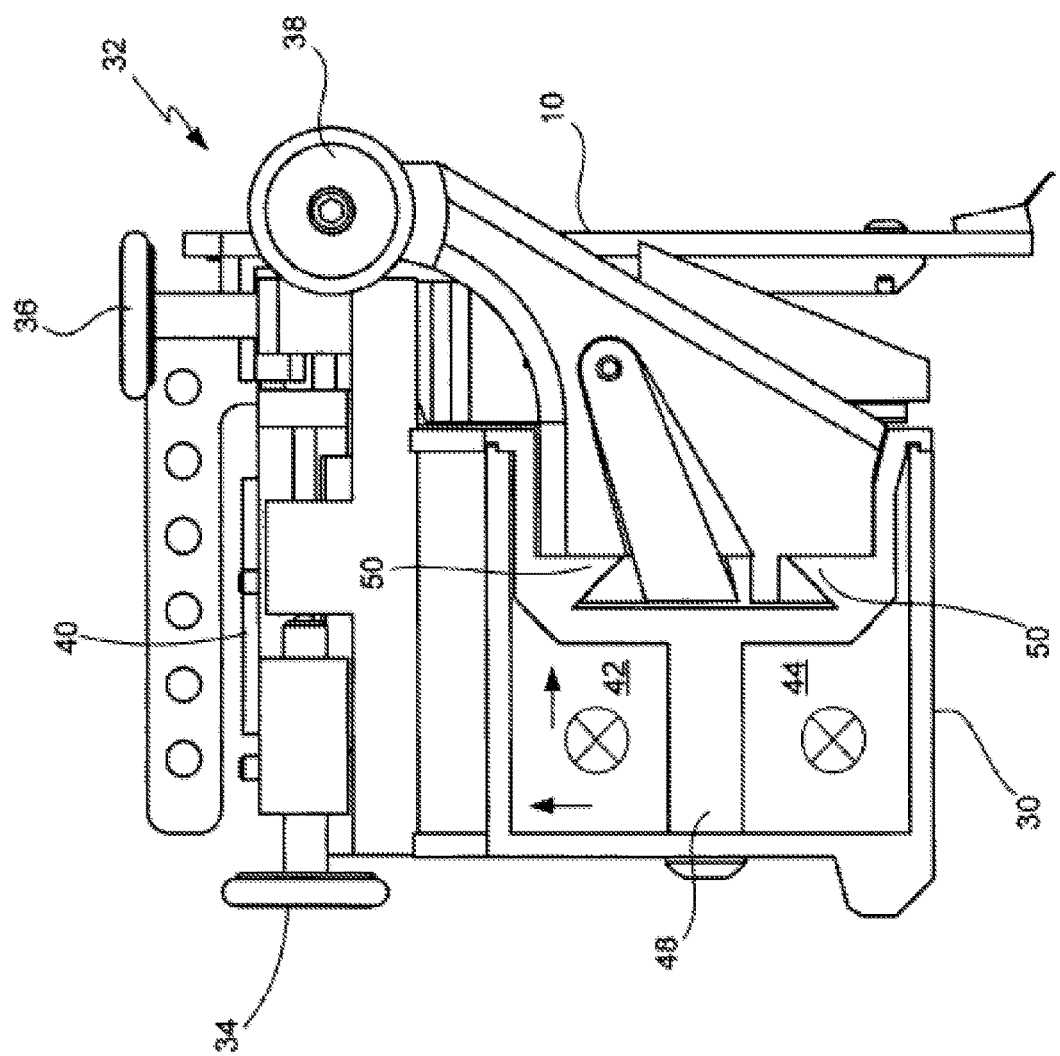
FIG. 5B is a section view of the support rail shown in FIG. 5A.

FIG. 5B is a section view of rail 30 which includes internal channels 42, 44 for the flow of air used for cooling probe head 32, probe card 10, and flex cable 40. Air from the internal channels is emitted through openings in rail 30 with the air being directed through probe head 32 and probe card 10 for disrupting convective hot air flow from the heated chuck which holds the device under test. Accordingly, overheating of flex cable 40 and the printed circuit board of test probe 10 can be avoided. In this embodiment is will be noted that channel 30 includes a member 48 having dovetail flanges which engage mating dovetail flanges of probe head 32 as shown generally at 50.

Figure 5C:
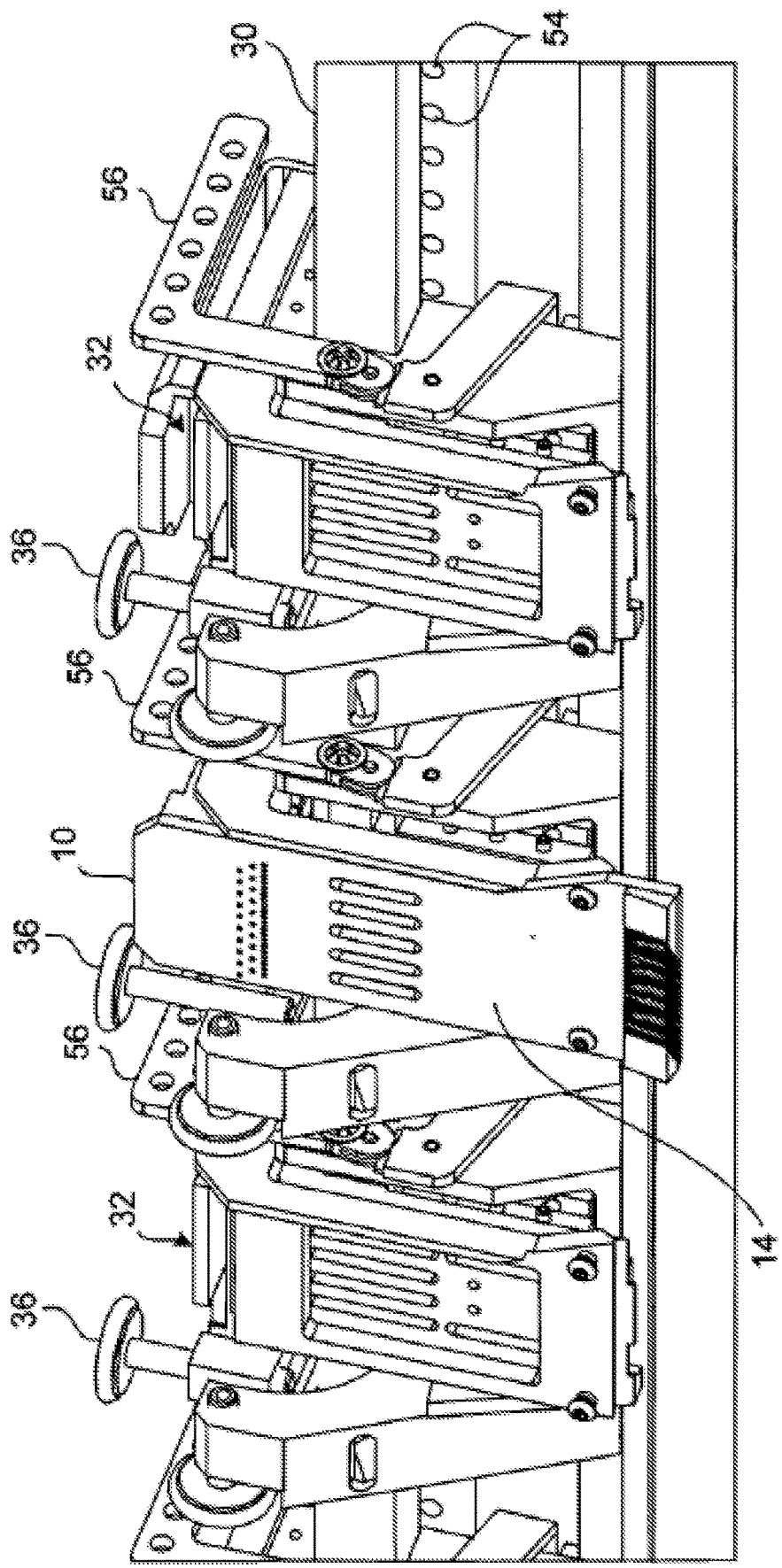
FIG. 5C is another perspective view of the rail supporting three probe heads.

FIG. 5C is another perspective view of the rail 30 supporting three probe heads 32. In this embodiment, only one probe card 10 is shown on the probe heads to further illustrate openings or slots for facilitating the flow of cool air from openings 54 in frame 30 through the probe heads 32 and through the openings 14 in probe card 10. It will be noted in this embodiment that each probe head 32 has a lever mechanism shown generally at 56 which can be used for locking a probe head in the dovetailed flanges 50 of rail 30.

Some probe station systems load wafers from the side using a cassette. Most conventional probe station systems that load a wafer from the front require the entire chuck assembly to be removed from the probe station. Removing the chuck assembly has a few drawbacks, including: (i) reduced mechanical stability of the chuck mechanism; (ii) increased complexity of the stage system, and (iii) significant temperature shift if the chuck is soaked at a specific elevated temperature.

An embodiment of the probe station 1000 provides a simple and elegant solution to this problem by using a 2-piece pivot arm 1100 that can rotate out of the front of the probe station 1000 to accept a wafer 1200, transport the wafer 1200 to a chuck surface, and then "open" the two wafer holding segments 1150 to retract out of the way while still enclosed within the probe station 1000. This front-loading feature for a single wafer 1200 allows a user to easily load the wafer 1200 from the front without causing a temperature shift for the chuck 1015, as the chuck 1015 remains within the probe station chamber 1060.

As shown in the illustrated embodiments, the probe station 1000 can be provided with a drop down front wafer loading door 1050 for covering and exposing an opening in its front face for loading and unloading wafers. In other embodiments, the door can have a different configuration, such as a sliding door or a side-swinging door. To facilitate easy single wafer loading, the probe station 1000 has an internally housed arm that can be rotated outwards to retrieve and deliver a wafer 1200 to the hot-chuck 1015.

A front loading mechanism for wafers is described with reference to FIGS. 6A-6E. FIG. 6E shows the interior chamber 1060 of the probe station 1000 as seen from the opening in the front face of the probe station 1000. Opening the drop down door 1050 provides access to the front loading mechanism for wafers 1200, such as 200 or 300 nm wafers. In FIG. 6E, the view is shown from the bottom side to illustrate the loading mechanism, which includes a pivot arm 1100 and two wafer supporting segments 1150, supporting a wafer 1200. In the embodiment shown in FIG. 6E, the two wafer supporting segments 1150 rotate about one end of the pivot arm 1100. The other end of the pivot arm 1100 rotates about a pivot point attached to a platform of the probe station 1000.

Figure 6A:
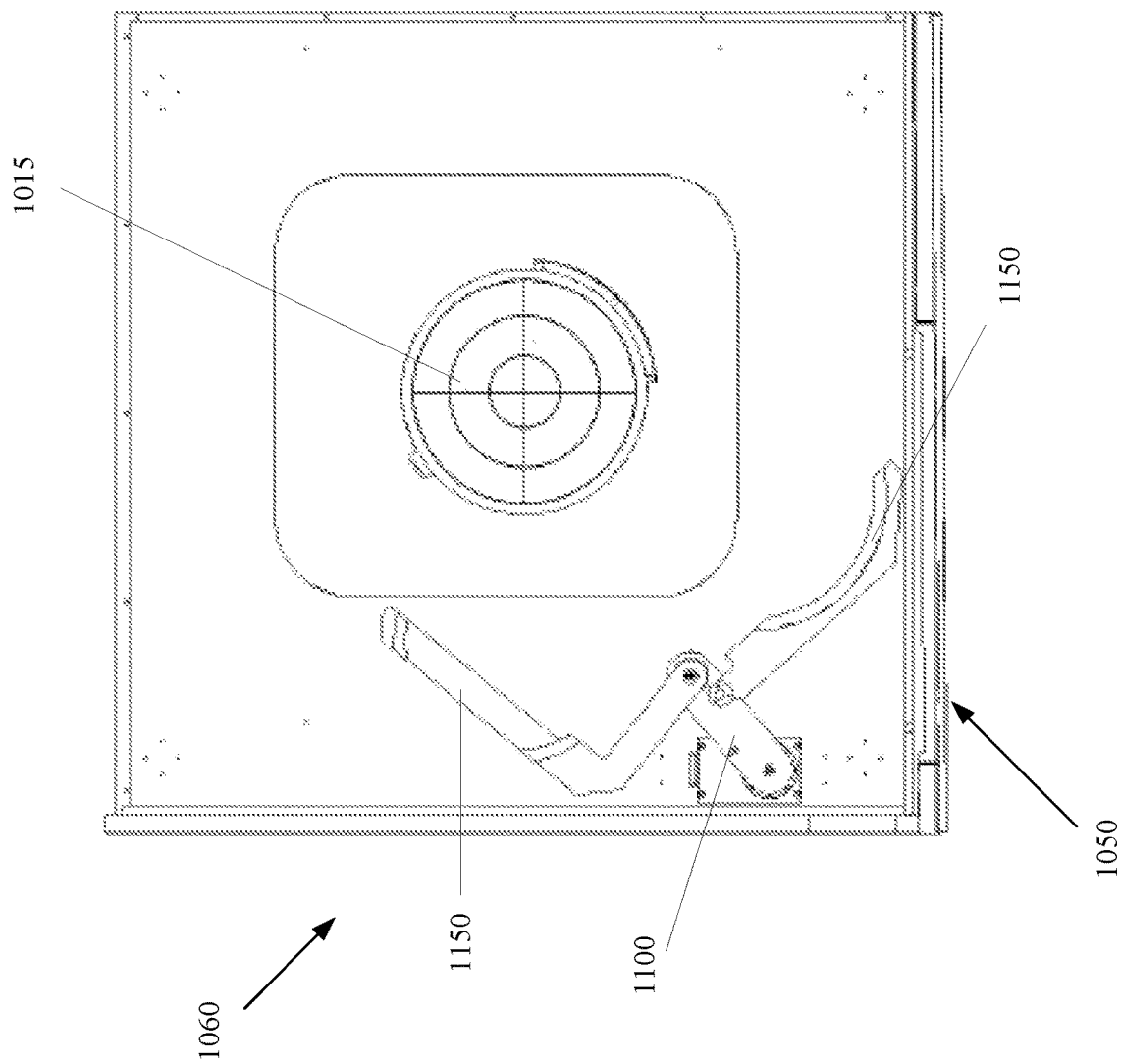
FIGS. 6A-6D show the movement of a wafer loading mechanism in an embodiment of a wafer probe station.

FIGS. 6A-6D show the wafer loading process in accordance with an embodiment. As shown in FIG. 6A, the chuck 1015 and the loading mechanism (pivot arm 1100 and two wafer supporting segments 1150) are in the housed position, which is also the testing position. The housed or testing position is the position in which the chuck 1015 and the loading mechanism are stored when not in use and when a wafer 1200 is supported by the chuck 1015 and being tested. As shown in FIG. 6A, the two wafer supporting segments 1150 are rotated away from one another and out of the way of the chuck 1015.

Figure 6B:
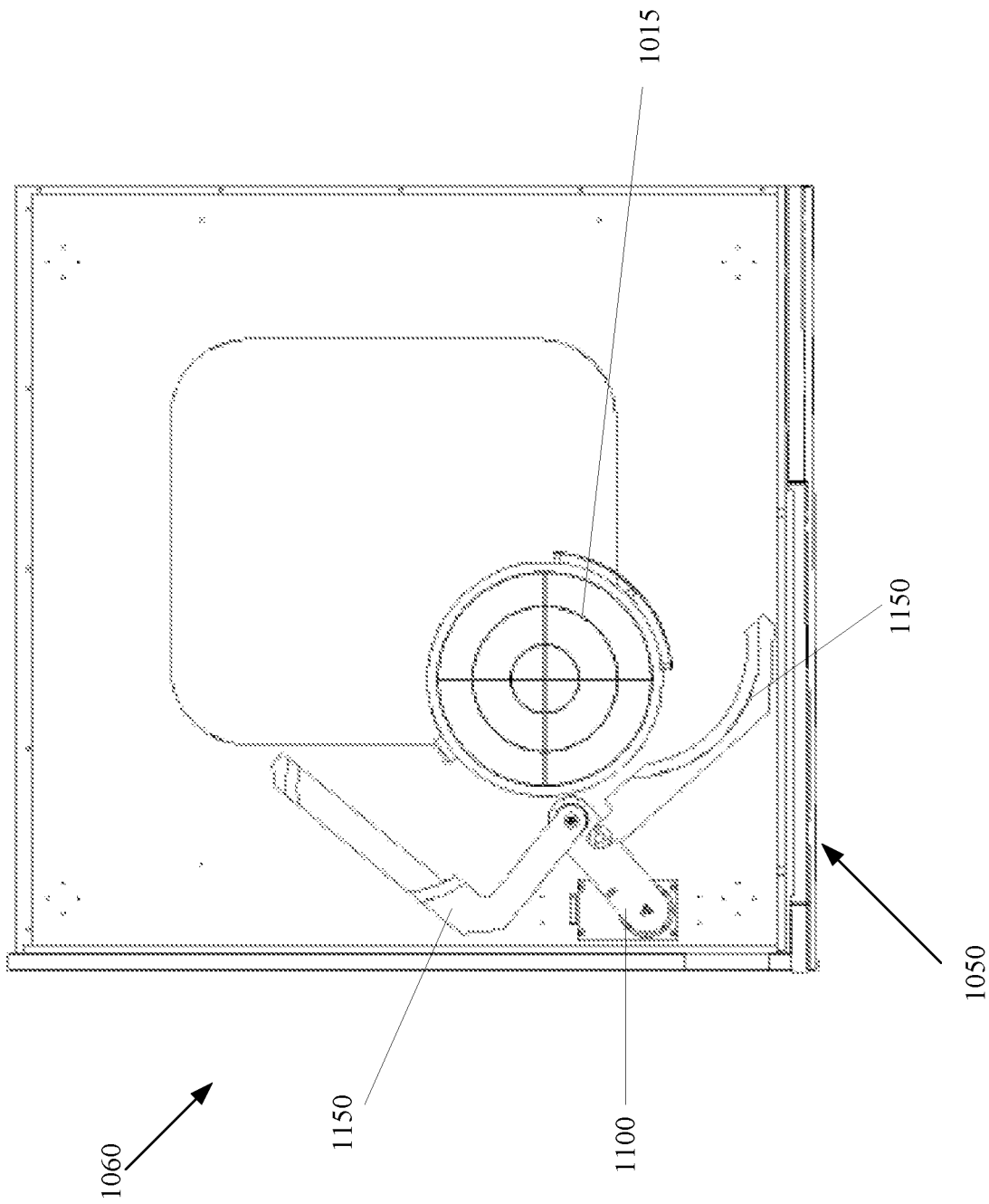

When a wafer 1200 is to be loaded, the user prompts the probe station 1000 system. When prompted via software, the chuck 1015 will move along the X, Y and Z axes from the test position to the loading position. As shown in FIG. 6B, the chuck 1015 moves toward the wafer supporting segments 1150 and the door 1050 into a loading position. According to an embodiment, the chuck 1015 also moves downward as it moves toward the wafer supporting segments 1150 and door 1050.

Figure 6C:
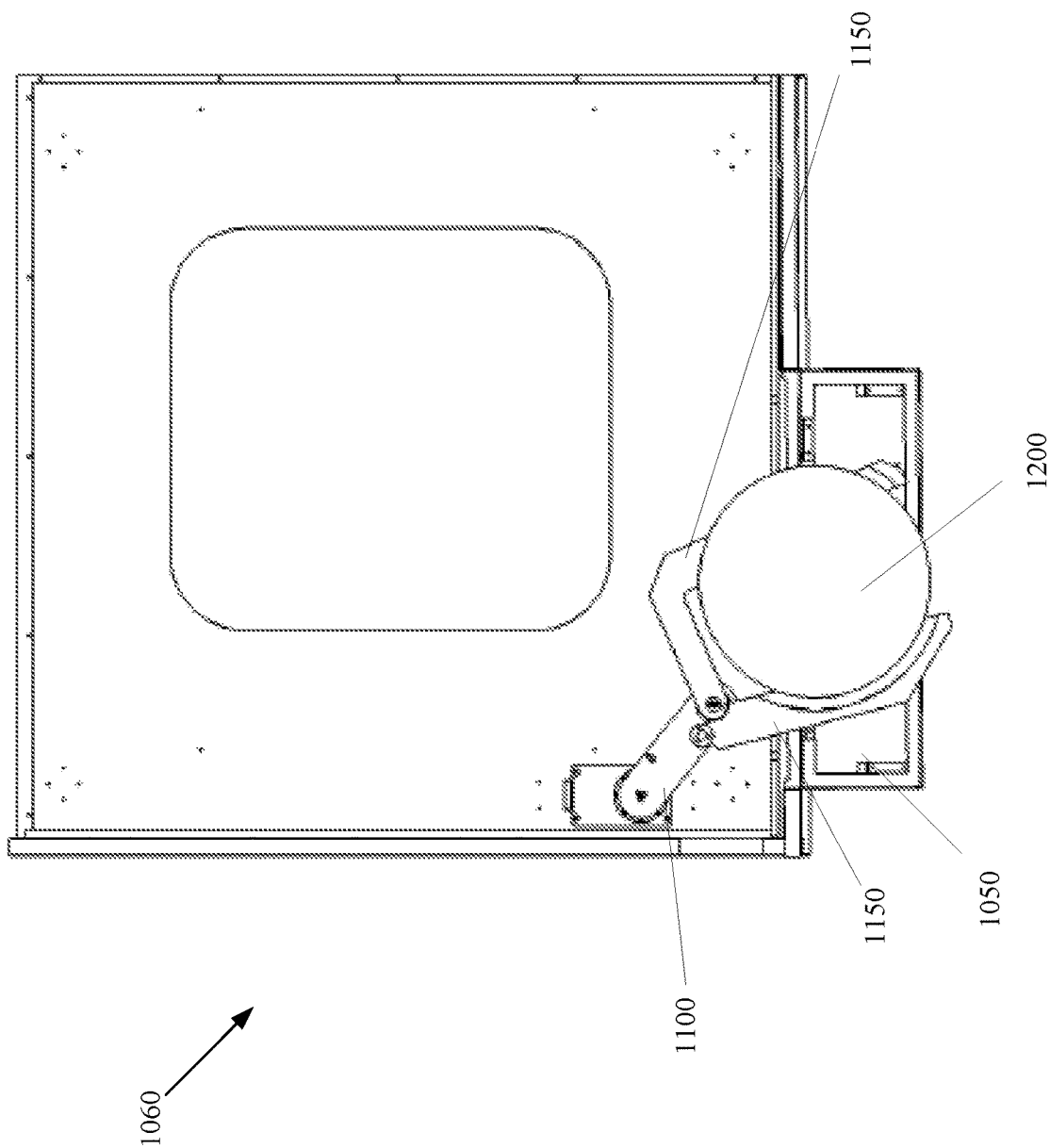

The door 1050 then opens and the two wafer supporting segments 1150 rotate toward one another and the pivot arm 1100 rotates the two wafer supporting segments 1150 forward out of the door opening so that a wafer 1200 can be loaded onto the wafer supporting segments 1150. As shown in FIG. 6C, the wafer 1200 can be placed onto the wafer supporting segments 1150 in this position. It will be understood that the chuck 1015 is not shown in FIG. 6C for simplicity and that the chuck 1015 is actually in the loading position within the chamber 1060 to which it was moved as shown in FIG. 6B.

Figure 6D:
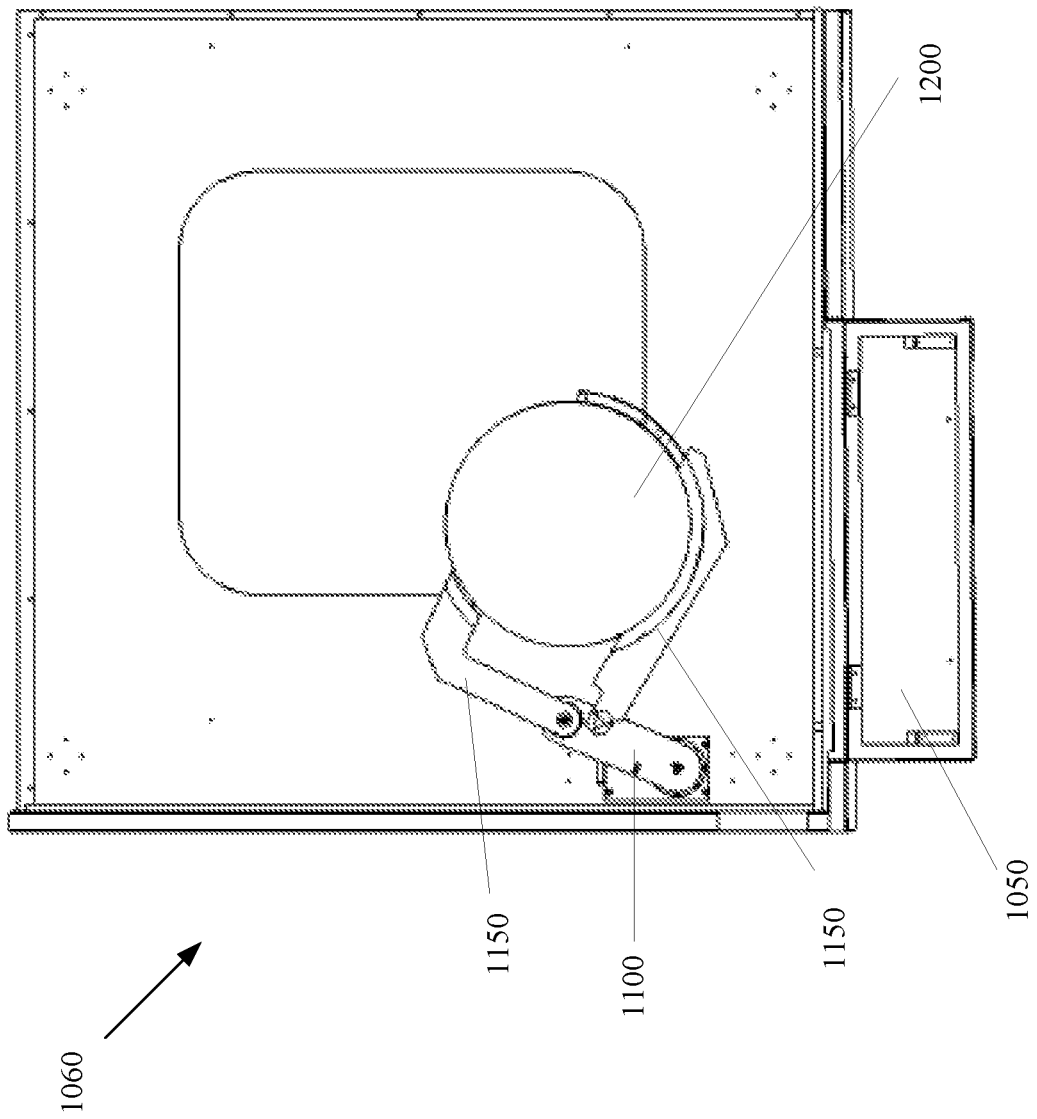
Figure 6E:
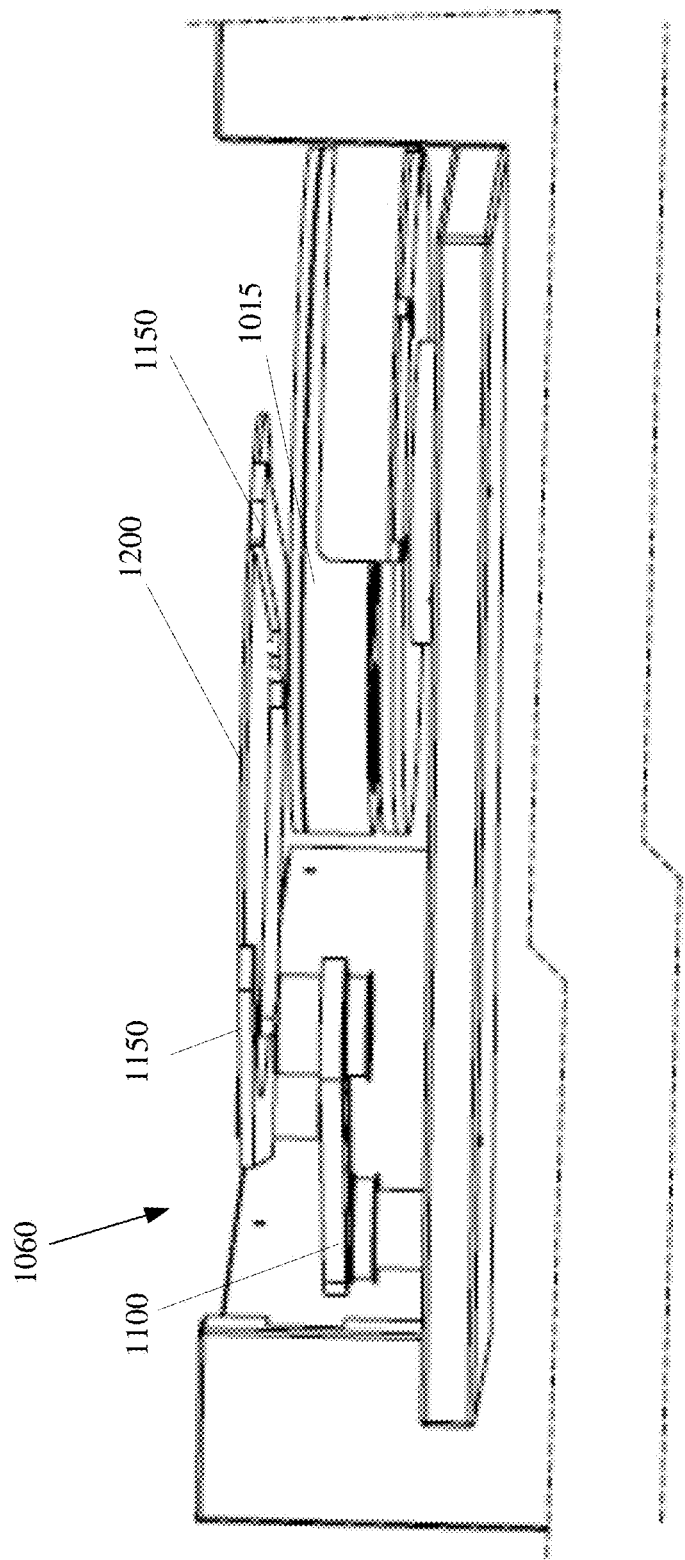
FIG. 6E is a perspective view of an embodiment of the wafer loading mechanism.

As shown in FIG. 6D, the pivot arm 1100 rotates the two wafer supporting segments 1150 and the supported wafer 1200 back into the chamber 1060 where the wafer 1200 can be placed onto the chuck 1015 in the loading position. The wafer supporting augments 1150 then rotate independently out of the way (back to the housed position), within the probe station chamber 1060. The chuck 1015, while supporting the wafer 1200, then rotates back to the testing position where the wafer 1200 can be tested using an interchangeable module (e.g., probe positioner, rail system, etc.), as described above.

With a traditional probe card setup on a semi-auto prober, users are generally limited to a single site, or a fixed number of sites with limited adjustment. An embodiment of the semi-automated probe station 1000 can handle up to 16 individually adjusted probe heads at a temperature as high as about 300° C., to allow for easy adjustment of a single site within the probe head array. This allows the user to customize the pattern, spacing, and number of heads being landed and used for testing. This also allows for repositioning of a single head (or more) if the device within the array is dead. The combination of the adjustable rail and head array, with the functionality of an automated XYZT stage provides a solution to maximize flexibility.

In order to accurately step and repeat landings with a wafer probing system, the user needs to have accurate information regarding the size of landing pads and the pitch between repeating die for testing. This can be problematic when either this information is unknown, or these values change due to thermal expansion of the silicon wafer itself. For example, 300 mm silicon wafers can expand in size significantly when elevated to 300° C., and the die pitch can become as much as 25 μm larger than at room temperature. In order to correct for this difference, an embodiment of the probe station 1000 utilizes an image processing and pattern recognition routine to detect and measure the spacing of die for each set temperature to offset this expansion and ensure accurate landings at any temperature.

Figure 7:
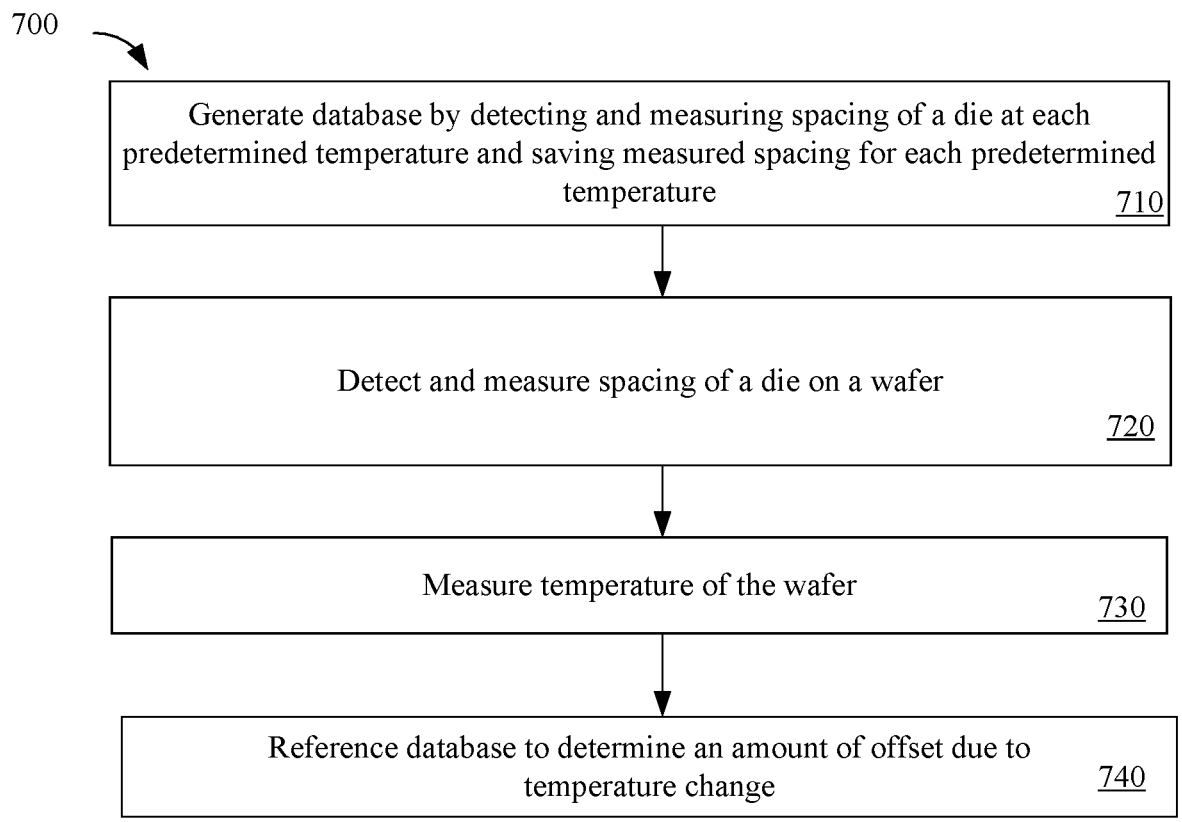
FIG. 7 is a flow chart of a method 700 for achieving accurate landings on a wafer at a temperature up to about 300 C in a wafer probe station.

FIG. 7 is a flow chart of a method 700 for achieving accurate landings on a wafer at a temperature up to about 300 C in a wafer probe station. According to this method 700, a database is generated, saved, and referenced by software to accurately compensate for the temperature offset from room temperature values. Pad size and other features can also be measured automatically, using image processing from the CCD and pattern recognition. In step 710, a database is generated by detecting and measuring spacing of a die at each predetermined temperature and saving the measured spacing for each predetermined temperature. In step 720, the spacing of a die on the wafer is detected and measured. In step 730, the temperature of the wafer is measured. In step 740, the database is referenced the determine the amount of offset due to temperature change, Overall, the positional accuracy and repeatability of the wafer chuck movement is vital for making good wafer contact possible. Good wafer contact is a factor of repeatable and appropriate scrub mark. "Scrub mark" is the trench and hillock formed on an exposed metal pad on the wafer surface when a downward force is applied from the probe needles. These scrub marks need to be on target, without the pins making contact with surrounding layers of passivation materials that can contaminate the pins, and skew electrical measurements from their true values. With pad sizes shrinking to as small as 30 μm×30 μm, and probe pins increasing in quantity per site, as well as pad to pad pitch, having a prober system accurate enough to ensure this landing is vital. An embodiment of the probe station 1000 employs a custom method of multi-point XY position calibration and correction.

Figure 8:
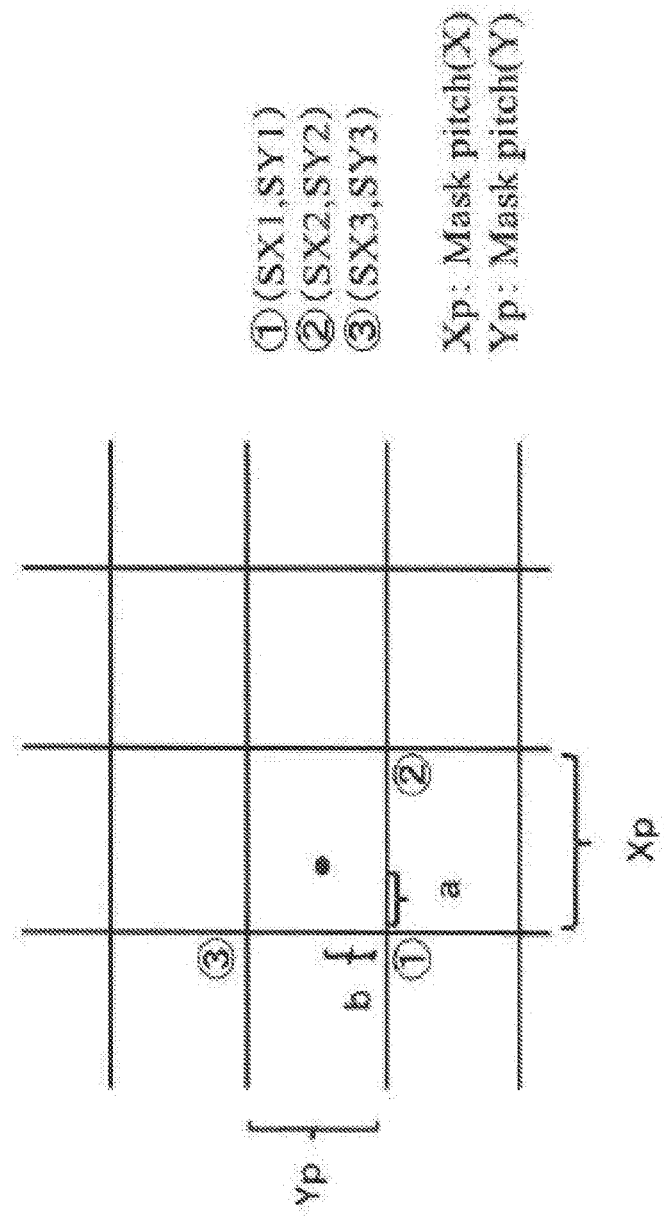
FIG. 8 an example of a NIST traceable reference glass, used in accordance with an embodiment.
Figure 9:
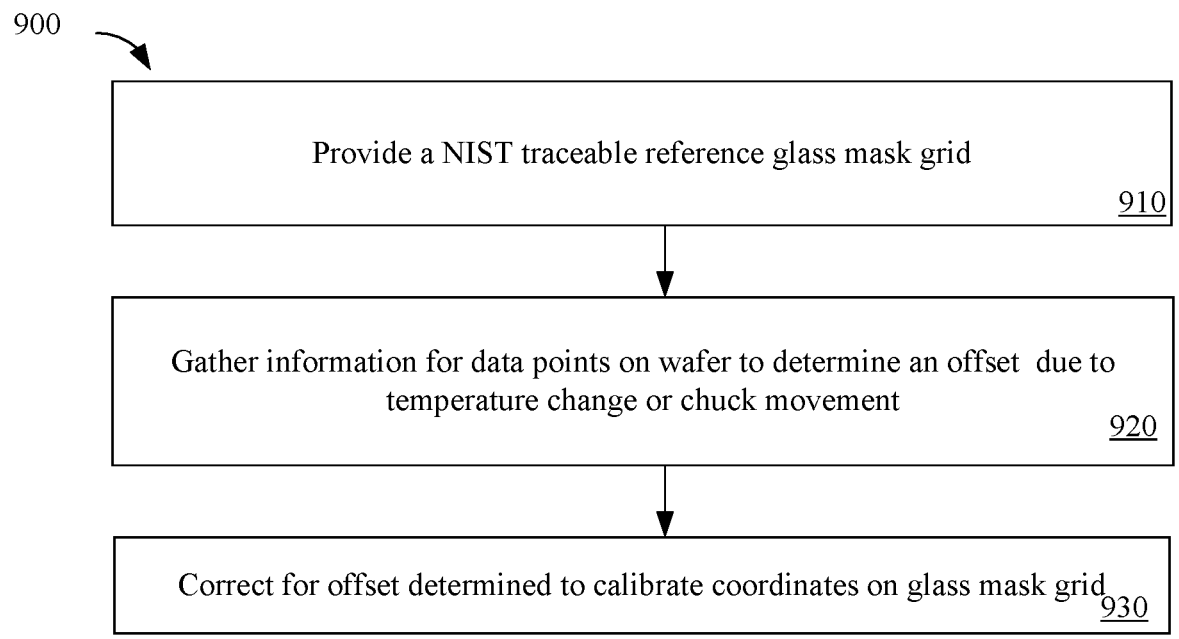
FIG. 9 is a flow chart of a method of calculating offset for a given point within the wafer area, based on measured values 1, 2 and 3, in accordance with an embodiment.

With reference to FIGS. 8 and 9, a method 900 of calculating offset for a given point within the wafer area, based on measured values 1, 2 and 3 will be described. The method employs a National Institute of Standards Testing (NIST) traceable reference glass, as shown in FIG. 8, which uses a grid of lines that can be recognized by a special software routine, and an image processing and pattern recognition software library. Using this method 900, information can be gathered for thousands of data points on the wafer, with regard to the offset. The offset is the difference between where the system thinks the wafer is, and where the wafer has actually moved. These values are then stored in a file to be referenced by the controller software, to then correct for these measured and known inaccuracies in position. According to the method 900, a NIST traceable reference glass mask grid is provided in step 910. In step 920, information for data points on the wafer is gathered to determine an offset due to temperature change or chuck movement. The offset is the difference between where the contact pad is supposed to be and where it actually has moved due to temperature change or chuck movement. In step 930, X and Y coordinates on the glass mask grid are calibrated by correcting for the offset determined in step 920. The calibration is performed to determine an accurate location for a contact pad.

Although only a few embodiments of the invention have been described in detail, it should be appreciated that the invention may be implemented in many other forms without departing from the scope of the invention. It should be apparent that the described wafer temperature measurement tool can be used in a wide variety of applications. In view of all of the foregoing, it should be apparent that the present embodiments are illustrative and not restrictive and the invention is not limited to the details given herein, but may be modified within the scope and equivalents of the appended claims.

What is claimed is:

1. A wafer probe station, comprising a probe station chamber comprising a chuck within the probe station chamber and a mounting plate capable of accepting a module selected from a plurality of different interchangeable modules, wherein the mounting plate is on a top surface of the wafer probe station and wherein each module is configured for interfacing at least one probe card with a wafer positioned on the chuck in the probe station chamber, wherein a module can be swapped for a different module and the mounting plate provides multiple ways for the wafer probe station to interface with a wafer by allowing different interchangeable modules to dock with the mounting plate when a module is positioned over the mounting plate, and wherein the plurality of different interchangeable modules comprises different types of modules including a probe positioner configured to align the at least one probe card with the wafer, an air-cooled rail assembly for supporting probe cards for testing multiple die on the wafer, and an adaptor for 4.5" or 6" probe cards, and wherein each type of module has a function that is different from functions of the other types of modules, wherein the mounting plate and each interchangeable module has mounting holes that are commonly sized and positioned for to allow for each module to be docked to the mounting plate using a fastener.

2. The wafer probe station of claim 1, wherein the probe positioner can move the at least one probe card linearly along three X, Y, Z axes as well as rotationally about the Z axis.

3. The wafer probe station of claim 2, wherein the probe positioner has an arm for positioning a probe card vertically above the wafer during testing of the wafer.

4. The wafer probe station of claim 2, wherein the positioner is a magnetic or vacuum based positioner.

5. The wafer probe station of claim 1 wherein the rail assembly can accommodate a plurality of individually adjustable probe heads.

6. The wafer probe station of claim 5, wherein the rail assembly positions the probe card vertically above the wafer during testing of the wafer.

7. The wafer probe station of claim 1, wherein the wafer probe station is capable of achieving accurate landings on a wafer at a temperature up to about 300° C. in the wafer probe station, the wafer probe station further comprising:

an image processor for detecting and measuring spacing of a die the wafer; and
a database generated by detecting and measuring spacing of a die at predetermined temperatures and saving measured spacing for each predetermined temperature in the database to determine an amount of offset for each predetermined temperature.

8. The wafer probe station of claim 1, further comprising a NIST traceable reference glass mask grid, wherein X and Y coordinates on the glass mask grid are calibrated to determine an accurate location for a contact pad to position probe needles on a contact pad on the wafer.

9. The wafer probe of claim 7, wherein the X and Y coordinates are calibrated by gathering information for data points on the wafer to determine an offset, wherein the offset is a difference between where the contact pad is supposed to be and where it actually has moved due to temperature change or chuck movement, and correcting for the offset determined.

10. A semi-automatic wafer probe station, comprising:
an interface capable of accepting a module selected from a plurality of different interchangeable modules, wherein each module is configured for interfacing at least one probe card with a wafer, wherein a module can be swapped for a different module;
a chuck; and
a rotating arm comprising a first segment and a second segment to directly support the wafer, wherein the wafer is supported by both the first segment and the second segment, and wherein the arm is configured to rotate and pivot out of an opening in a front surface of the wafer probe station such that the first segment and the second segment are outside the wafer probe station to accept the wafer on a top surface of the first segment and on a top surface of the second segment and the arm is also configured to rotate and pivot into the wafer probe station to load the wafer to a surface of the chuck such that the arm is completely within the wafer probe station, wherein the first segment and the second segment are configured to retract away from the wafer and the chuck after loading the wafer to the surface of the chuck, and wherein the first segment and the second segment rotate about a first end of the rotating arm away from one another when the first segment and the second segment retract away from the wafer and the chuck.

11. The wafer probe station of claim 10, wherein the first segment and the second segment are movable between a position inside the chamber and a position at least partially outside the chamber.

12. The wafer probe station of claim 11, wherein the chuck is movable between a test position of the chuck and a loading position of the chuck.

13. The wafer probe station of claim 12, wherein the test position of the chuck and the loading position of the chuck are within the chamber.

14. The wafer probe station of claim 11, wherein the first segment and the second segment are movable to a position at least partially out of an opening in a front face of the wafer probe station.

15. The wafer probe station of claim 14, further comprising a door that opens to expose the opening in the front face of the wafer probe station.

* * * * *